United States Patent [19]
Ueyama et al.

[11] Patent Number: 5,571,325
[45] Date of Patent: Nov. 5, 1996

[54] SUBTRATE PROCESSING APPARATUS AND DEVICE FOR AND METHOD OF EXCHANGING SUBSTRATE IN SUBSTRATE PROCESSING APPARATUS

[75] Inventors: Tsutomu Ueyama; Hideki Adachi, both of Kyoto; Yoshio Matsumura, Hikone; Yasuhide Tanaka, Kyoto, all of Japan

[73] Assignee: Dainippon Screen Mfg. Co., Ltd., Japan

[21] Appl. No.: 476,052

[22] Filed: Jun. 7, 1995

Related U.S. Application Data

[63] Continuation of Ser. No. 170,094, Dec. 20, 1993, abandoned.

[30] Foreign Application Priority Data

Dec. 21, 1992 [JP] Japan ..................... 4-356752
May 27, 1993 [JP] Japan ..................... 5-151160

[51] Int. Cl.⁶ ............................................. B05C 13/02
[52] U.S. Cl. .................... 118/320; 414/222; 414/217; 414/935; 414/936; 414/940
[58] Field of Search .................... 118/320, 319; 414/935, 939, 222, 217, 609, DIG. 1, DIG. 2, DIG. 6, 3–5

[56] References Cited

U.S. PATENT DOCUMENTS

| | | | |
|---|---|---|---|
| 4,981,408 | 1/1991 | Hughes et al. | 414/222 |
| 4,985,722 | 1/1991 | Ushijima et al. | 354/319 |
| 5,032,052 | 7/1991 | Swain | 414/222 |
| 5,061,144 | 10/1991 | Akimoto et al. | 414/935 |
| 5,100,516 | 3/1992 | Nishimura et al. | 414/222 |
| 5,145,303 | 9/1992 | Clarke | 414/939 |
| 5,275,709 | 1/1994 | Anderle | 414/217 |

FOREIGN PATENT DOCUMENTS

| | | |
|---|---|---|
| 63-5523 | 1/1988 | Japan. |
| 282522A | 3/1990 | Japan. |
| 282618A | 3/1990 | Japan. |

Primary Examiner—James C. Housel
Assistant Examiner—Rachel Freed
Attorney, Agent, or Firm—Ostrolenk, Faber, Gerb & Soffen

[57] ABSTRACT

A substrate processing apparatus comprises a processing part and a transferring part. In the processing part there are a plurality of stages in which a plurality of processing units are arranged in a row along a horizontal direction and the stages are arranged in a stack vertically. Thus, the processing units are arranged in matrix. The transferring part includes a plurality of horizontal transferring devices each movable in the horizontal direction and a vertical transferring device movable in the vertical direction. Hence, a substrate is movable both horizontally and vertically to be transferred to the desired processing unit.

13 Claims, 29 Drawing Sheets

FIG. 3
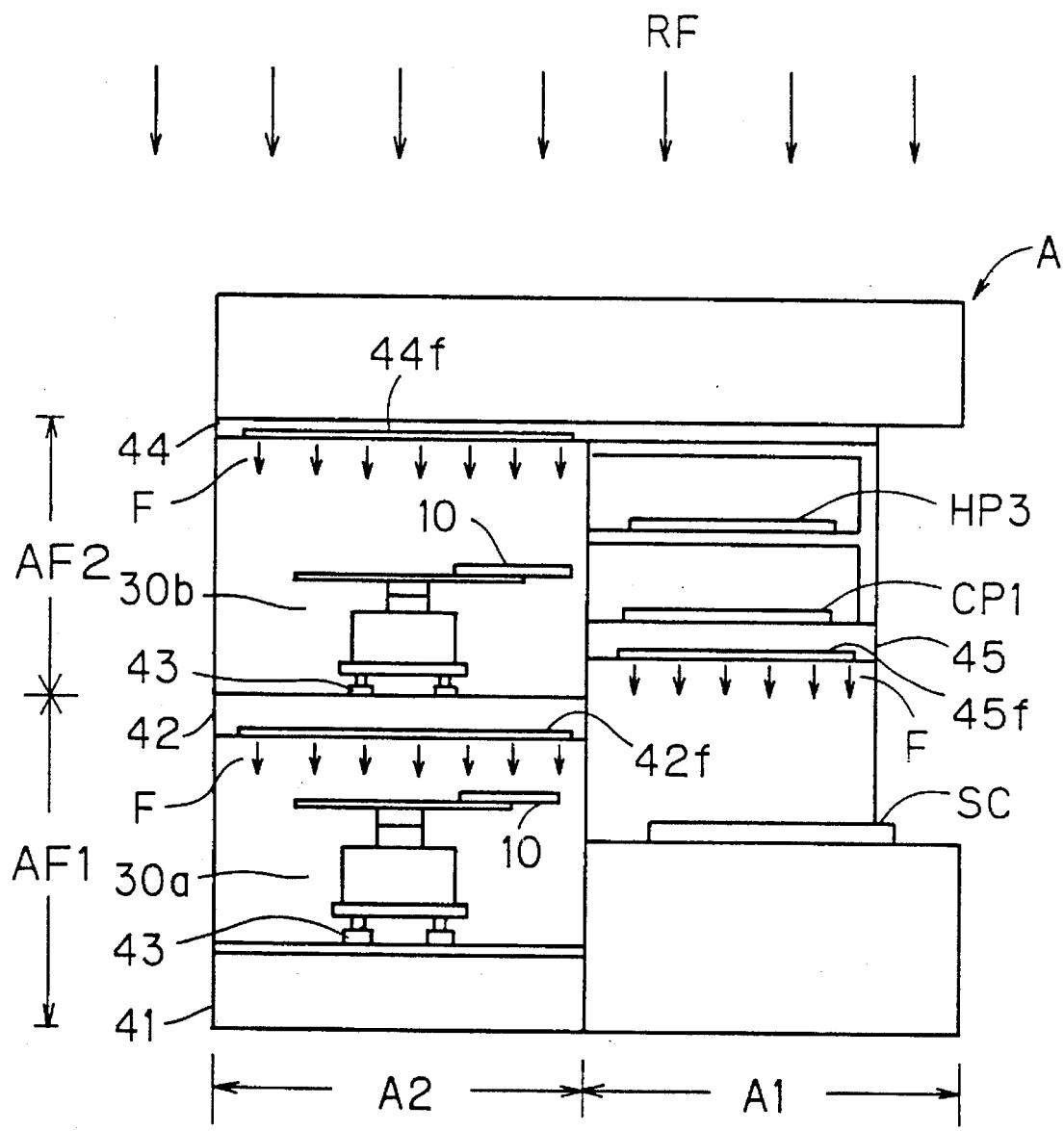
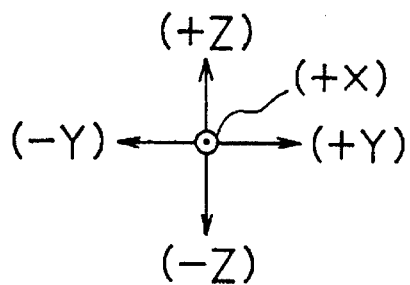

FIG. 4
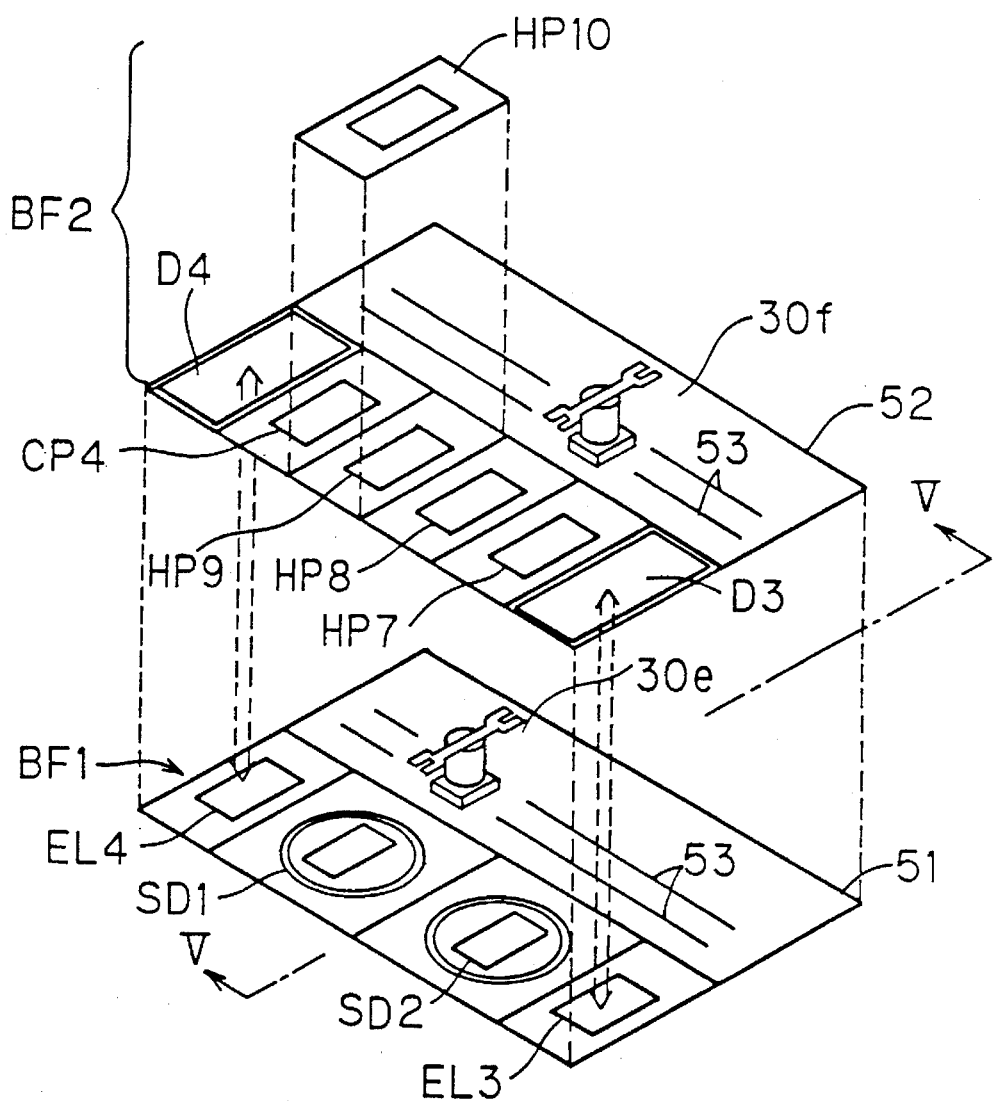
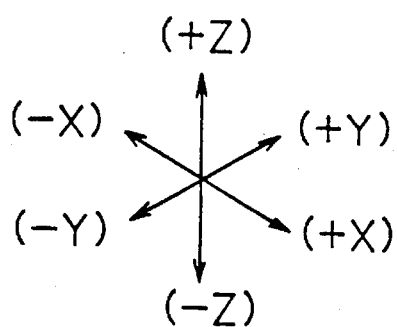

FIG.5
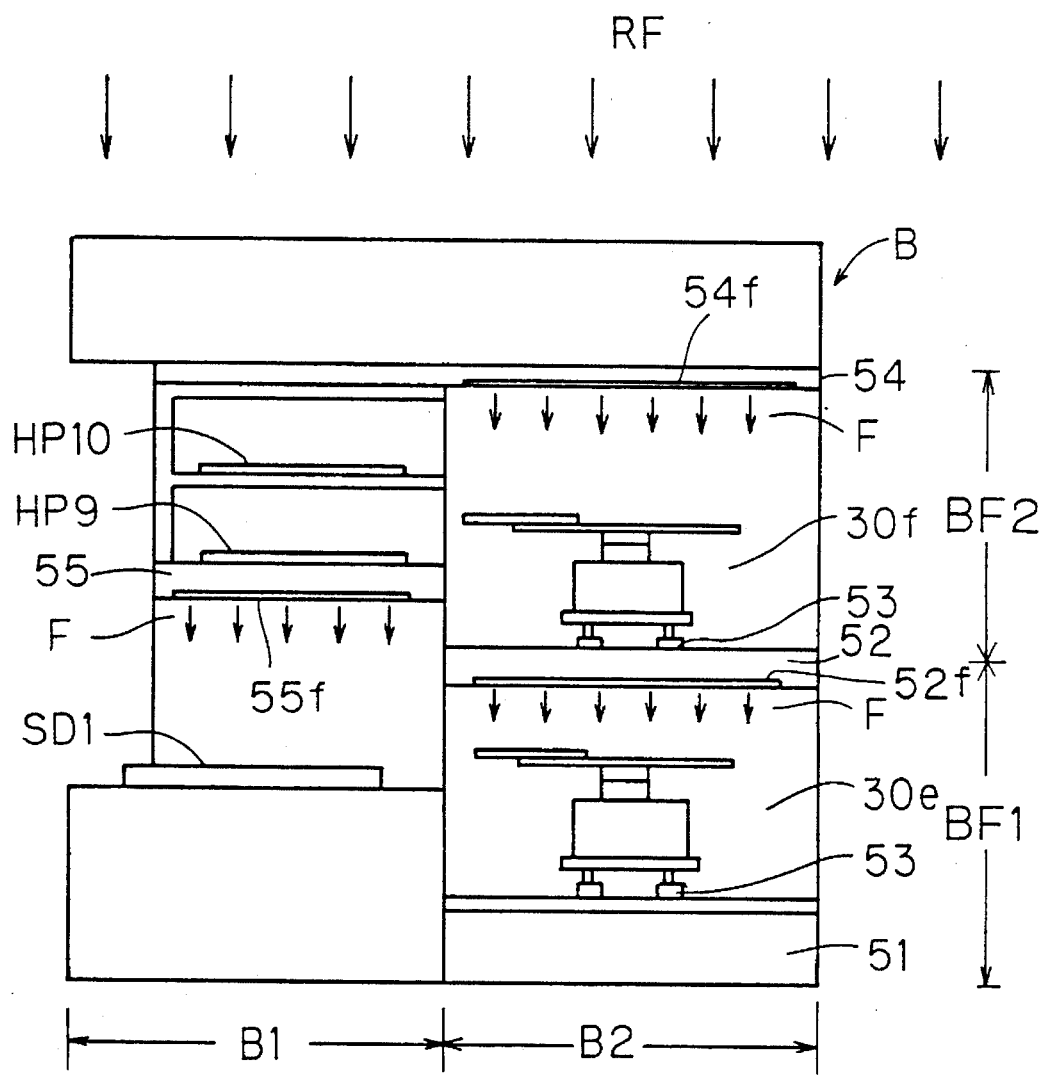
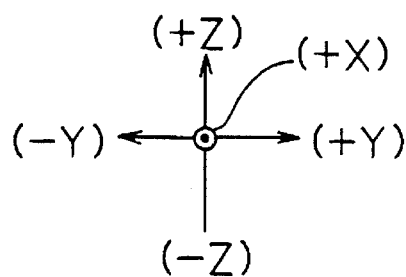

FIG. 9
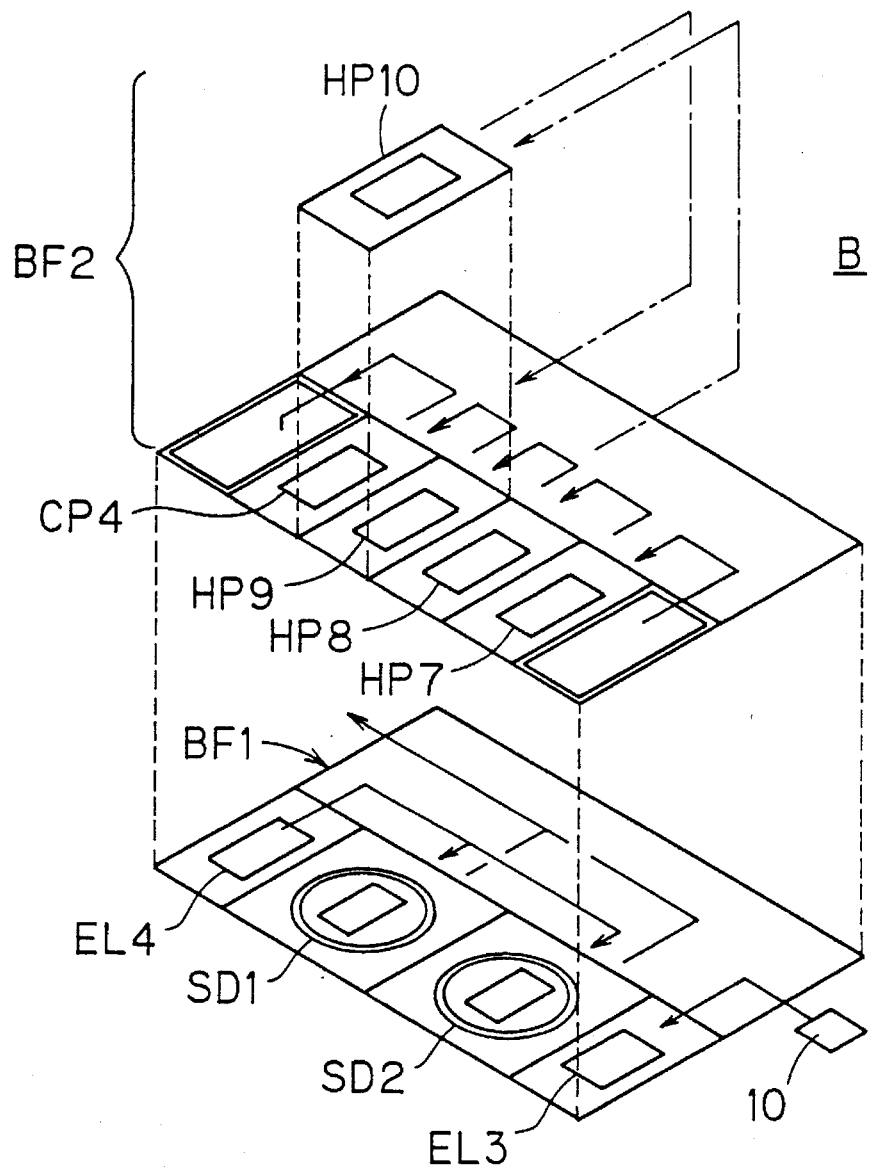
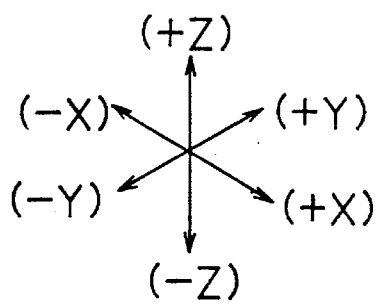

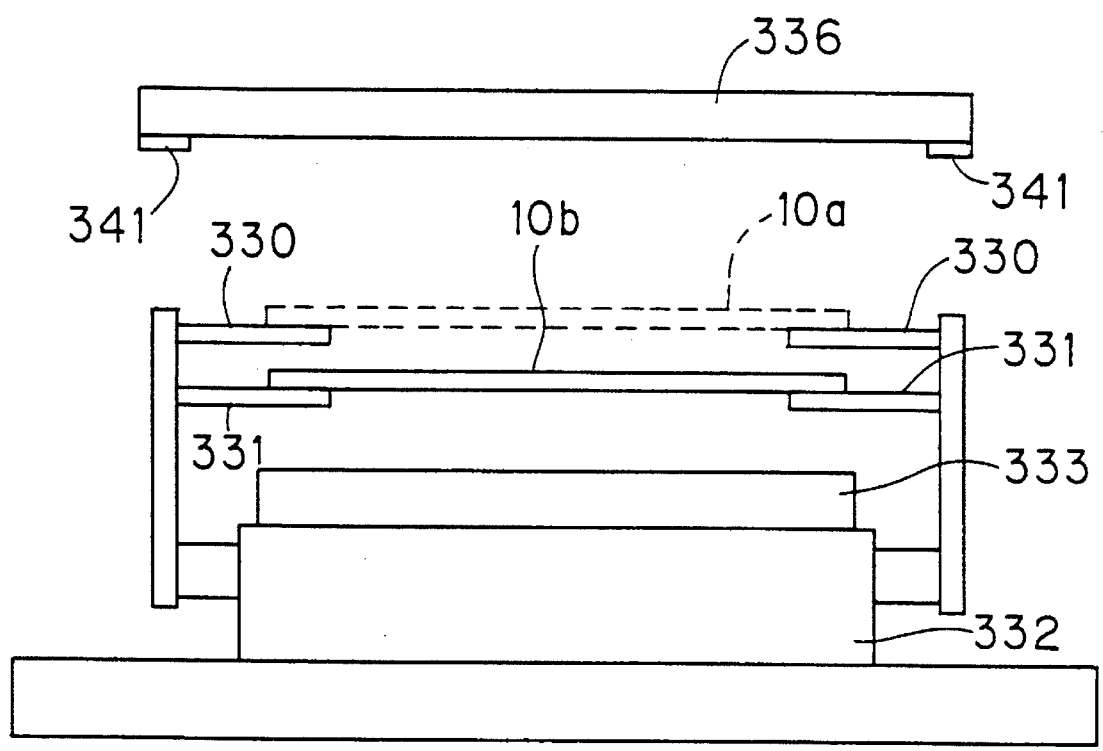
F I G. 25

HP

SUBTRATE PROCESSING APPARATUS AND DEVICE FOR AND METHOD OF EXCHANGING SUBSTRATE IN SUBSTRATE PROCESSING APPARATUS

This is a continuation of application Ser. No. 08/170,094 filed on Dec. 20, 1993, now abandoned.

BACKGROUND OF THE INVENTION

1. Field of the Invention

The present invention is directed to a substrate processing apparatus for processing a substrate in a plurality of processing units in a predetermined order by transferring the substrate between said plurality of processing units. The present invention is also directed to a device for and a method of transferring substrates in the substrate processing apparatus by removing a processed substrate from a processing unit and by inserting a substrate to be processed to the processing unit, such as a resist coating device, substrate cleaning device, substrate developing device, substrate heating device, substrate cooling device, exposing device and so on.

2. Description of the Background Art

In manufacturing fine electronic substrates such as liquid crystal displays and semiconductor devices, it is necessary to have a plurality of processing units described above and a transferring device, which transfers substrates such as glass substrates for liquid crystal displays or semiconductor wafers to the plurality of processing units in a predetermined order.

In one prior art apparatus, all of the plurality of processing units are arranged in a horizontal row on a floor. However, this arrangement of processing units causes an increase of the floor area required for the apparatus by increasing total length of the apparatus, since many processing units are necessary for manufacturing fine electronic substrates such as liquid crystal displays and semiconductor devices. This arrangement has the further disadvantage of being difficult to modify, from a predetermined order, the order of processing units in which a substrate is processed, since the substrate transferring device of this arrangement is designed to transfer a substrate in a predetermined order in a specified direction. It is difficult to change such predetermined order and/or such specified direction. That is, for transferring the substrate in a different order from said predetermined order, the substrate must be transferred in the opposite direction to said specified direction or must bypass a specified processing unit. This transferring causes interference between a plurality of substrates transferred in series.

U.S. Pat. No. 4,985,722 discloses a second prior art apparatus in which a plurality of processing units are arranged in two laterally spaced horizontal rows spaced in parallel with each other, and a substrate transferring device is positioned in the space formed between the two horizontal rows. In this second prior art apparatus, it is easy to modify, from a predetermined order, the order of those processing units in which a substrate is processed, because such modification is achieved by a change of action of the substrate transferring device without modification of arrangement of the processing units. The total length of the apparatus of the second prior art apparatus is shorter than that of the first prior art, since the plurality of processing units are arranged in two horizontal rows. However, the floor area required for operating the apparatus of the second prior art is not reduced in comparison with that of the first prior art, since the apparatus of the second prior art is different from that of the first prior art only in the arrangement of the plurality of processing units.

Furthermore, in the second prior art apparatus, the check and/or repair of the substrate transferring device is difficult, since it is positioned between the two horizontal rows. The second prior art apparatus has the further disadvantage that the time required for exchanging substrates in a processing unit increases. That is, in the second prior art apparatus, a processed substrate is taken out of a processing unit, and a next substrate, which has not been processed in that processing unit, is taken into the processing unit thereafter.

Japanese Laid-Open Patent Application No. Sho63-5523 discloses a third prior art apparatus in which a plurality of processing units are arranged vertically one by one and a substrate is transferred only in the vertical direction.

This arrangement embodied in the third prior art apparatus can reduce the floor area required for the apparatus in comparison with apparatus of the first and second prior arts. However, the height of the third apparatus increases, especially for apparatus including a large number of processing units. Therefore, in the third prior art apparatus, the number of processing units included in the apparatus must be limited by the ceiling height of factory in which the apparatus is to be installed. In the arrangement disclosed in the third prior art it is also inconvenient to check and/or repair a processing unit arranged at or near the top of the apparatus.

Because some of the processing units included in this type of apparatus are heavy and/or require many pipes for supplying a plurality of different treating liquids, such processing units should not be arranged at relatively high locations. Therefore, the arrangement disclosed by the third prior art is a poor design choice. Similar to the first prior art apparatus, this third apparatus has the further disadvantage that it is difficult to modify, from a predetermined order, the order of those processing units in which a substrate is processed. In the third prior art apparatus, the substrate transferring device, for transferring the substrate between the plurality of processing units, transfers the substrate vertically by relatively long distances. The particles generated by such transference of the substrate settle on the processing units disposed at relatively low positions, causing contamination of such processing units and substrates thereat. The substrate transferring device used in the third prior art apparatus must transfer a large number of substrates only in a vertical direction, many of the transferring paths necessary for transferring substrates from a specified processing unit to the next specified processing unit, must be designed for avoiding interference between all of the transferring paths. This serves to increase the time required for processing a substrate in all of the processing units in a predetermined order.

SUMMARY OF THE INVENTION

The present invention is directed to a substrate processing apparatus for processing a substrate by a plurality of processing units by transferring the substrate between the plurality of processing units in series, each of the processing units processing the substrate in a predetermined manner. This apparatus comprises a processing section including a lower processing row wherein some of the plurality of processing units are arranged in a predetermined horizontal direction, and an upper processing row wherein others of the plurality of processing units are arranged in the predetermined horizontal direction, the upper processing row being arranged above the lower processing row in parallel with the latter. Transferring means, arranged along both of the upper and lower processing rows, are provided for transferring the substrate in both the horizontal and vertical directions from a predetermined one of the plurality of processing units in both of the upper and lower processing rows to another one thereof.

The present invention is also directed to a device for exchanging substrate in substrate processing apparatus that includes a plurality of processing units. The device comprises upper and lower substrate holding mechanisms, provided in each of the processing units, for holding respectively thereon a processed substrate which has been processed in the processing unit and a next substrate which is to be processed next in the processing unit; upper and lower hands, moveable into and out of each of the processing units, for taking the processed substrate out of a specified processing unit and taking the next substrate into the specified processing unit, the vertical space between the upper and lower hands being variable; space controlling means for controlling the vertical distance between the upper and lower hands, to transfer the processed substrate held on either of the upper and lower substrate holding mechanisms to either of the upper and lower hands, and to transfer the next substrate held on either of the upper and lower hands to either of the upper and lower substrate holding mechanisms; and means for controlling the movement of the upper and lower hands, to transfer the processed substrate from the processing unit to the other processing unit and to transfer the next substrate to the processing unit.

The present invention is further directed to a method of exchanging substrates in substrate processing apparatus that includes a processing unit, upper and lower substrate holding mechanisms provided in the processing unit for holding respectively thereon a processed substrate which has been processed in the processing unit and a next substrate which is to be processed next in the processing unit, and upper and lower hands, movable into and out of the processing units, for taking the processed substrate out of the processing unit and taking the next substrate into the processing unit, with the vertical space between the upper and lower hands being variable. The method comprises the steps of: (a) holding the processed substrate on the upper substrate holding mechanism in the processing unit and holding the next substrate by the lower hand located outside of the processing unit; (b) inserting the upper and lower hands into the processing unit with the next substrate being held by the lower hand; (c) simultaneously moving the upper hand upwardly to receive the processed substrate held on the upper substrate holding mechanism, and moving the lower hand downwardly to transfer the next substrate held thereby to the lower substrate holding mechanism; and (d) removing the upper and lower hands from the processing unit with the processed substrate being held by the upper hand.

In another aspect of the present invention, the method comprises the steps of: (a) holding the processed substrate on the lower substrate holding mechanism in the processing unit and holding the next substrate by the upper hand located outside of the processing unit; (b) inserting the upper and lower hands into the processing unit with the next substrate being held by the upper hand; (c) simultaneously moving the lower hand upwardly to receive the processed substrate held on the lower substrate holding mechanism, and moving the upper hand downwardly to transfer the next substrate held thereby to the upper substrate holding mechanism; and (d) removing the upper and lower hands from the processing unit with the processed substrate being held by the lower hand.

Accordingly, an object of the present invention is to provide a substrate processing apparatus in which an order of processing a substrate can be modified easily.

Another object of the present invention is to provide a substrate processing apparatus which is compact in size.

Still another object of the present invention is to provide a substrate processing apparatus in which it is easy to check and/or repair substrate a transferring device for transferring a substrate between a plurality of processing units in the apparatus.

Yet another object of the present invention is to provide a substrate processing apparatus which decreases the time required for processing a substrate in all of the processing units in a predetermined order.

A further object of the present invention is to provide a substrate transferring apparatus combined in substrate processing apparatus, which can avoid contamination often caused by operation of prior art transferring apparatus to substrates to be processed and processing units.

A still further object of the present invention is to provide a device for and method of exchanging substrates in substrate processing apparatus, which operates efficiently to take a substrate into each of the processing units and remove a substrate processed by each of processing units from the processing unit.

These and other objects, features, aspects and advantages of the present invention will become more apparent from a study of the following detailed description of the present invention when taken in conjunction with the accompanying drawings.

BRIEF DESCRIPTION OF THE DRAWINGS

FIG. 3 is a side view looking in the (−X) direction along line III—III of FIG. 2;

FIG. 4 is a schematic arrangement of the second sub-system in the embodiment;

FIG. 5 is a side view looking in the (−X) direction along line V—V of FIG. 4;

FIG. 9 is a perspective showing flow of a substrate in the second sub-system;

FIG. 25 is an internal front view of the hot plate;

DESCRIPTION OF THE PREFERRED EMBODIMENTS

A. Substrate Processing Apparatus

<A-1. Overall Structure of the Apparatus>

Figure 1:
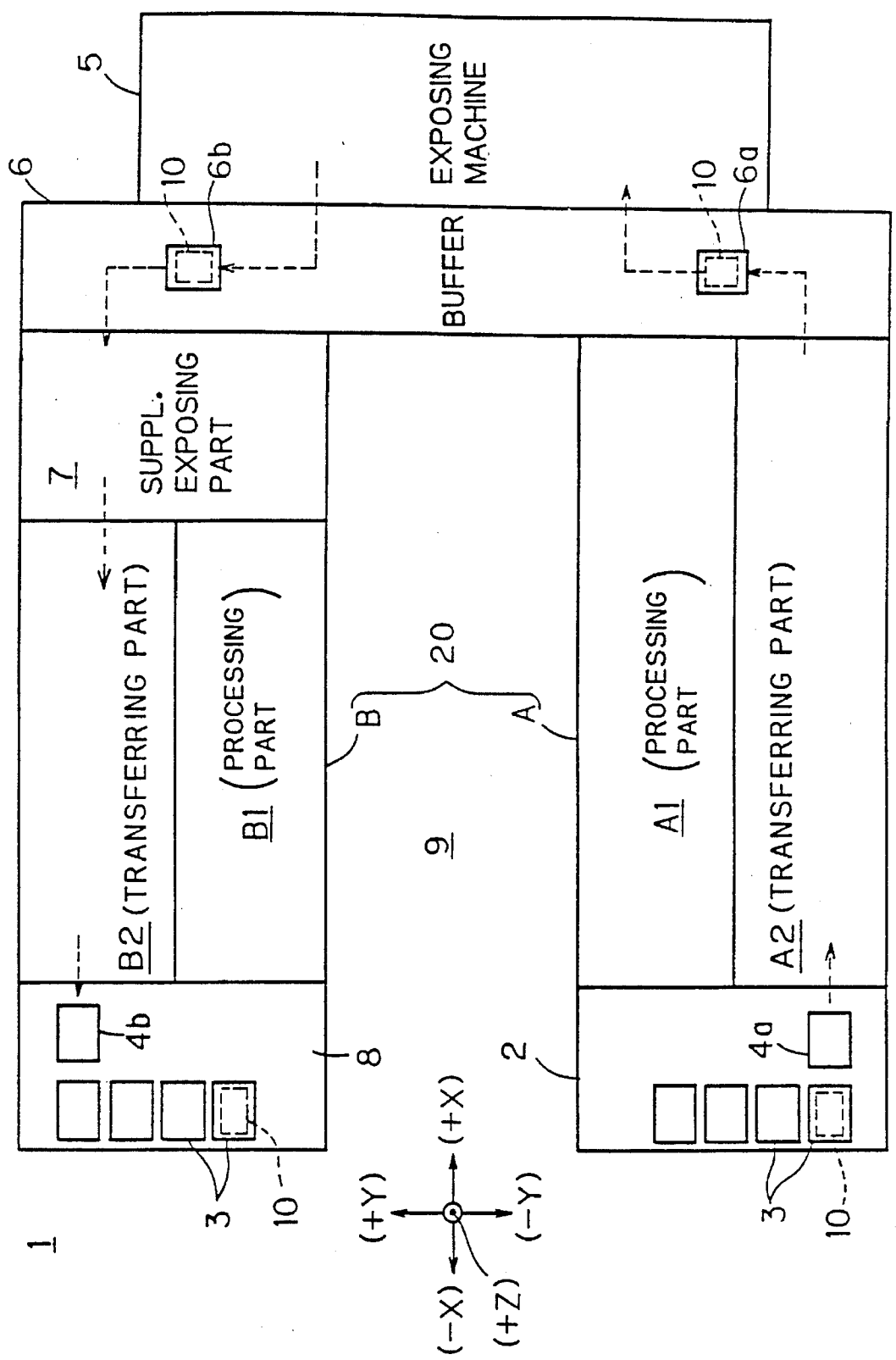
FIG. 1 is a plan view of an embodiment of a substrate processing apparatus according to the present invention.

The substrate processing apparatus 1 of FIG. 1 functions as an apparatus for forming patterns of electrodes or the like on a substrate to be processed, such as a liquid crystal display substrate.

In FIG. 1 and the following drawings, symbols (±X) and (±Y) represent the directions, parallel to a floor, which orthogonally intersect with each other in the floor plane, and symbols (±Z) represent the vertical directions which orthogonally intersect with these directions (±X) and (±Y). Thus, these directions define a three dimensional rectangular coordinate system. Furthermore, symbol X represents the (+X) and/or (–X) direction, and symbol Y and Z represent the corresponding directions, similarly.

As shown in FIG. 1, the apparatus 1 has a substantially inverted C-shape and comprises a processing system 20 which includes first and second sub-systems A and B disposed in parallel to each other and back to back. There is a space 9 between the first and second sub-systems A and B. The first sub-system A is to provide a preliminary treatment to a substrate 10 having a resist film prior to an exposing process while the second sub-system B is to provide a post-treatment to the exposed substrate 10, both of the sub-systems A and B extending in the X direction.

A substrate loading station 2 is connected to one end portion of the first sub-system A which is in the (–X) direction side. A plurality of substrates 10 rinsed with pure water are stored with a cassette 3, and thereafter the cassette 3 storing the substrates 10 is carried into the substrate loading station 2. In the station 2, each substrate 10 is taken out of the cassette 3 and transferred into the first sub-system A by a substrate transferring robot 4a operable to move in the X direction (indicated by a dashed arrow).

The first sub-system A comprises a processing part A1 and a horizontal transferring part A2. The processing part A1 performs predetermined processes to the substrate 10 and transfers the substrate 10 in the vertical direction. The horizontal transferring part A2 transfers the substrate 10 along a row of the processing part A1, i.e. in the X direction. The processing part A1 is faced to the space 9 while the horizontal transferring part A2 is arranged in the opposite side of the space 9 across the processing part A1.

The first sub-system A has a specific structure to perform the preliminary treatment to the substrate 10, so that photoresist is coated on the surface of the substrate 10. The structure of and the treatment in the first sub-system A will be explained later.

The substrate 10, subjected to processing in the first sub-system A, is transferred into a buffer 6 extending in the Y direction between the first and second sub-stations A and B. An exposing machine, i.e. step-and-repeat machine 5 stands by the buffer 6.

A robot 6a is provided in the buffer 6 to hold each substrate 10 over the exposing machine 5 which transfers patterns onto the resist film using a predetermined mask. The exposed substrate 10 is returned to the buffer 6 and then carried into a supplementary exposing part 7 by another robot 6b. The supplementary exposing part 7 includes an edge exposing machine and a character printing machine, so that the resist film on the substrate 10 is subjected to edge exposing as well as character printing. Upon completion of the edge exposing and the character printing, the substrate 10 is transferred to the second sub-system B.

Similarly, the second sub-system B has a processing part B1 and a horizontal transferring part B2. The parts A1 and B1 stand back to back so as to sandwich the space 9. The horizontal transferring part B2 stands adjacent processing part B1 on the side thereof, opposite of the space 9.

The structure and the operation of the second sub-system B2 will also be explained later. Upon completion of processing in the second sub-system B, the resist film has been developed. Each substrate 10 having the developed resist film is carried into unloading station 8 and then stored with the cassette 3 by a robot 4b movable in the Y direction.

The cassette 3 storing the processed substrates 10 is transferred from the unloading station 8 to the next processing station.

<A-2. Structure of First Sub-system A>

Figure 2:
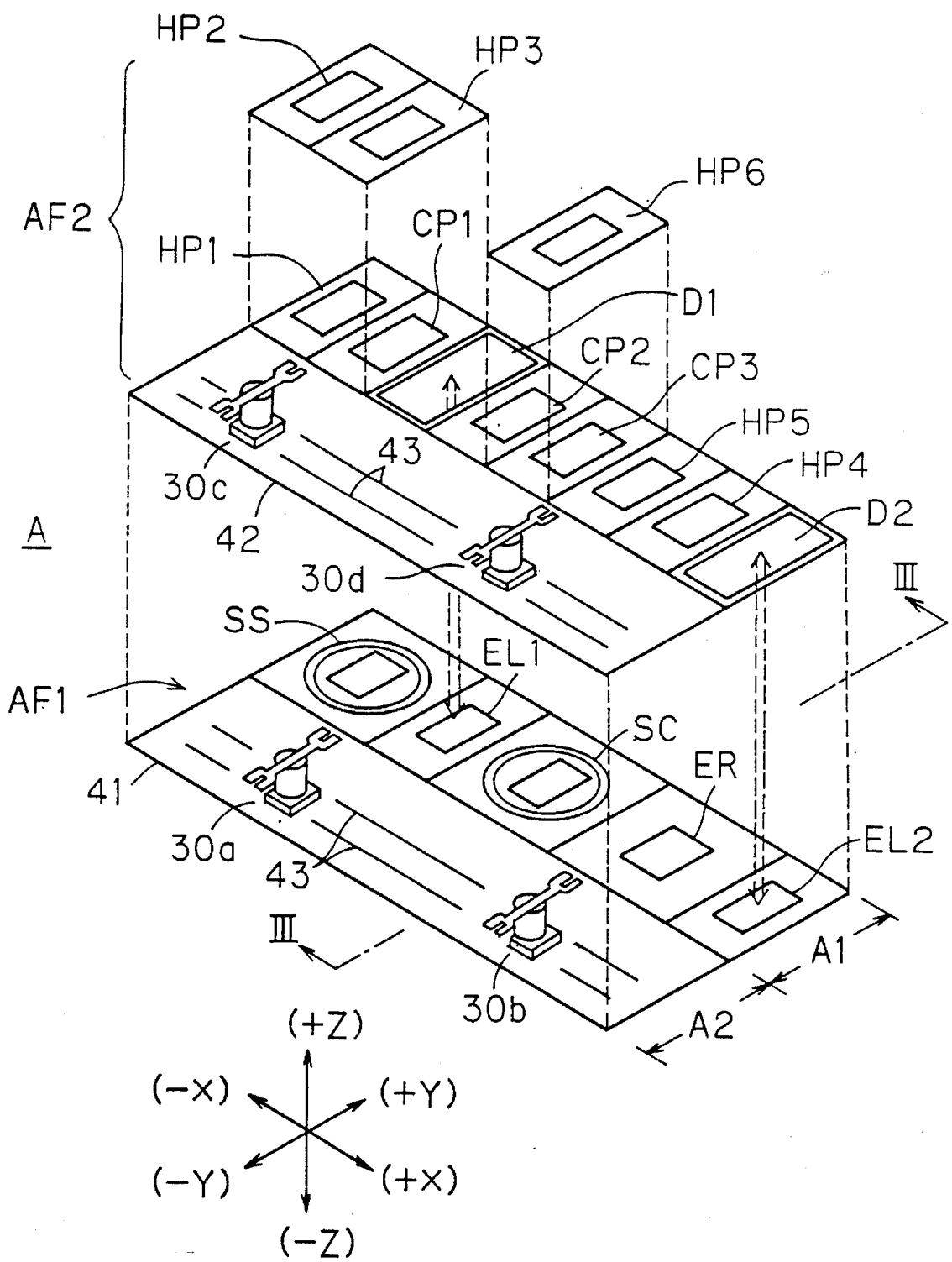
FIG. 2 is a schematic arrangement of the first sub-system in the embodiment of FIG. 1.

FIG. 2 is a schematic arrangement view of the first sub-system A and FIG. 3 is a side structure view taken in the (–X) direction along line III—III of FIG. 2.

In the sub-system A seen best in FIGS. 2 and 3, a plurality of processing units are arranged in a two dimensional matrix so that first and second stages AF1 and AF2 are stacked in the Z direction. The first stage AF1 of the processing part A1 comprises a spin scrubbing device SS, a spin coating device SC and a rinsing part ER for removing unnecessary resist film formed on the edge and back portions of the substrate 10 which are disposed in the X direction. Elevators EL1 and EL2 are provided between the first and second stages AF1 and AF2 and go up and down in the Z direction as indicated by a dashed double arrow.

The horizontal transferring part A2 is located in the front side of the processing part A1, i.e. in the (–Y) side. The horizontal transferring part A2 includes a floor 41, extending in the X direction, on which a guide rail 43 is secured. Two handlers 30a and 30b are mounted on the guide rail 43, so as to be operable to travel in the X direction along the guide rail 43. The handlers 30a and 30b function as substrate transferring means for transferring the substrate 10 among the processing units. The structure of the handlers 30a and 30b will be explain later.

The second stage AF2 is positioned above the first stage AF1. The second stage AF2 has a two-layer structure, in which a first layer is formed by hot plates (oven) HP1, HP4 and HP5 and cool plates CP1 to CP3 arranged in the X direction. A second layer is formed by hot plates HP2, HP3 and HP6. As shown in FIG. 3, the corresponding processing units (for example, the cool plate CP1 and the hot plate HP3) are stacked up in the Z direction. Openings D1 and D2 are opened at portions of the second layer, the portions being just above the upper portions of the elevators EL1 and EL2. Thus, the elevators EL1 and EL2 can move between the stages AF1 and AF2 through the openings D1 and D2.

Similarly, in the second stage AF2, a horizontal transferring part is present in the front side of processing part A1. The horizontal transferring part includes a floor 42 extending in the X direction. A guide rail 43 extending in the X direction is fixed on the floor 42. Two handlers 30c and 30d are mounted on the guide rail 43, so as to move in the X direction along guide rail 43.

Each of the processing parts SS, SC, ER, HP1 to HP6 and CP1 to CP3 corresponds to the "processing unit" according to the present invention. The processing units SS, SC and ER are disposed in a row in the first stage AF1 to form in a row while the processing units HP1 to HP6 and CP1 to CP3 are disposed in the second stage AF2 to form in a row, so that multi-stage type processing rows are structured. It is understood from FIG. 2 that a single layer of the processing units is formed in the first stage AF1 while two layers of the processing units are formed in the second stage AF2. Thus, the first sub-system A has a two-stages and three-layers structure of the processing units.

Referring to FIG. 3, a filter 42f is disposed between a ceiling surface of the first stage AF1 and the floor 42 of the second stage AF2. Clean air F flows from the ceiling surface of the first stage AF1 through the filter 42f toward the floor 41 as well as from the ceiling surface of the second stage AF2 through a filter 44f toward the floor 42. Thus, the "down flow" of the clean air is partially formed in the respective first and second stages AF1 and AF2. Furthermore, a filter 45f is disposed on a ceiling surface above the devices provided in the processing part A1 so that clean air flow downwardly through the filter 45f toward the devices.

The local down flows F prevent down flow RF, applying to the whole apparatus, from being disturbed by movement of the handler 30a to 30d, and carry particles generated in each stage away from the substrate and the processing units. The floor 42 also prevents particles generated in the second stage AF2 from moving to the first stage AF1. The down flow may be downwardly formed across the moving path of the handlers 30a to 30d obliquely.

<A-3. Structure of Second Sub-system B>

FIG. 4 is a schematic arrangement view of the second sub-system B and FIG. 5 is a side structure view taken in the (−X) direction along line V—V of FIG. 4.

Similarly, the second sub-system B has a two-stages and three-layers structure of the processing units. The processing part B1 comprises two spin developing devices SD1 and SD2 which are disposed in the X direction. Elevators EL3 and EL4 are provided so as to sandwich the spin developing devices SD1 and SD2.

In the front side of the processing part B1, i.e. in the (+Y) side, a horizontal transferring part B2 is arranged. The horizontal transferring part B2 has a floor 51 on which a guide rail 53 is secured. A handler 30e is mounted on the guide rail 53, and moves in the X direction along the guide rail 53 to transfer the substrates among a first stage BF1.

Second stage BF2 has a two-layers structure of the processing units. A first layer of the second stage BF2 includes hot plates HP7 to HP9 and a cool plate CP4 which are disposed in a row, and has openings D3 and D4 through which the elevators EL3 and EL4 move in the Z direction. A second layer of the second stage BF2 includes a hot plate HP10.

The second stage BF2 includes a horizontal transferring part extending in the X direction which is arranged in the front side of the processing part, i.e., in the (+Y) side. A handler 30f is mounted on a guide rail 53 which is secured on the floor 52, to move in the X direction. Thus, the substrate is transferred in the second stage BF2 by means of the handler 30f.

Referring to FIG. 5, filters 52f, 54f and 55f are attached on the respective ceiling surfaces 52, 54 and 55 in the stages. Clean air flows downwardly through these filters 52f, 54f and 55f, resulting in forming down flow F or oblique flow of the clean air.

In the second sub-system B, each of processing units SD1, SD2, HP1 to HP10 and CP4 of FIG. 4 corresponds to the "processing unit." The processing units SD1 and SD2 in the first stage BF1 are disposed in a row while the processing units HP7 to HP10 and CP4 in the second stage AF2 are disposed in a row, so that a multi-stage multi-row type processing is formed.

<A-4. Structure and Operation of Handler>

Figure 6:
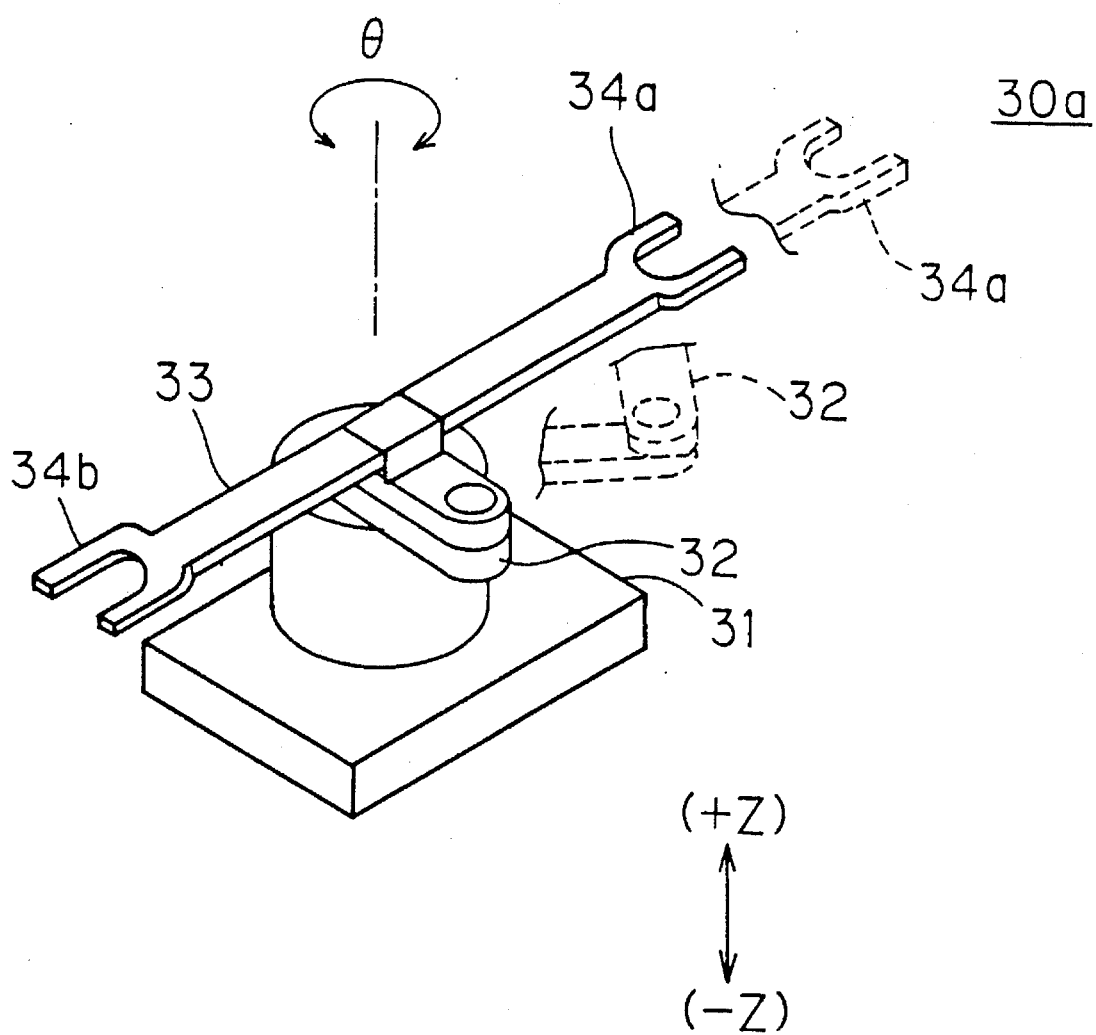
FIG. 6 is a diagrammatic perspective view of the handler.

FIG. 6 is a diagrammatic perspective view of the handler 30a. Other handlers 30b to 30f are identical in structure to the handler 30a.

The handler 30a comprises an arm 33 with two fingers 34a and 34b which are secured on both ends thereof. The arm 33 is pivotally mounted on a base 31 through a link 32 to rotate along the θ direction with respect to the horizontal plane. When driven by a motor (not shown) connected to the link 32, the arm 33 moves forwardly and backwardly. The arm 33 can also go up and down. Thus, the handler 30a is a R-θ-Z robot and can transfer the substrates without generating particles. The handler 30a moves along guide rail 43 of FIG. 2. The handlers are connected to a driving and controlling unit (not shown). Although the fingers 34a and 34b are fitted on both ends of the linear arm 33 shown as being 180 degrees apart, an L-shaped member may be used as the arm 33, for example. In this case where the L-shaped arm 33 is used, the fingers 34a and 34b can be 90 or 60 degrees apart.

Figure 7A:
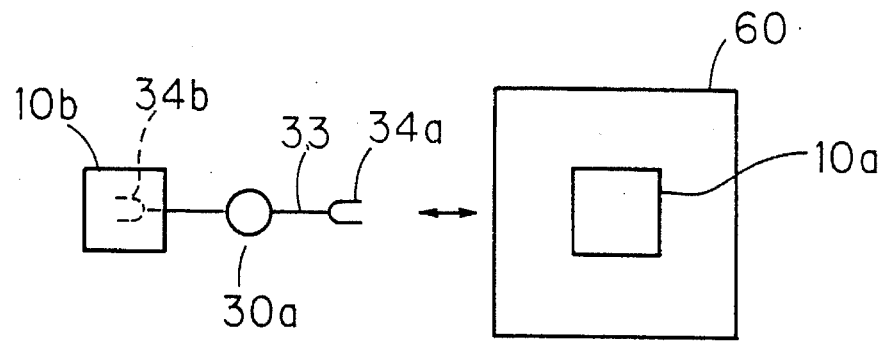
FIGS. 7A, 7B and 7C are schematics illustrating the operation of the substrate transferring device.
Figure 7B:
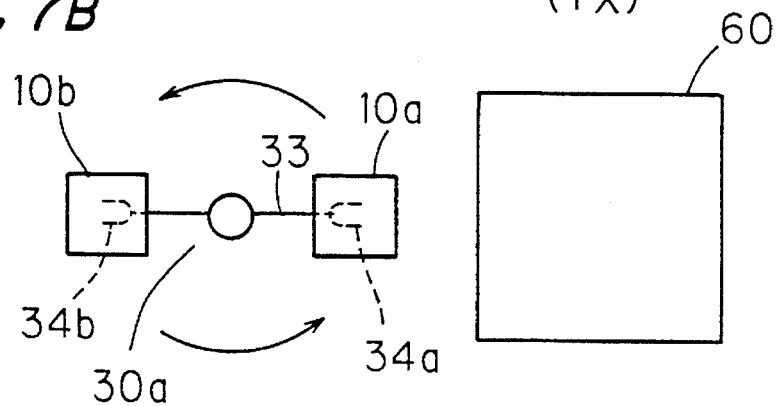
Figure 7C:
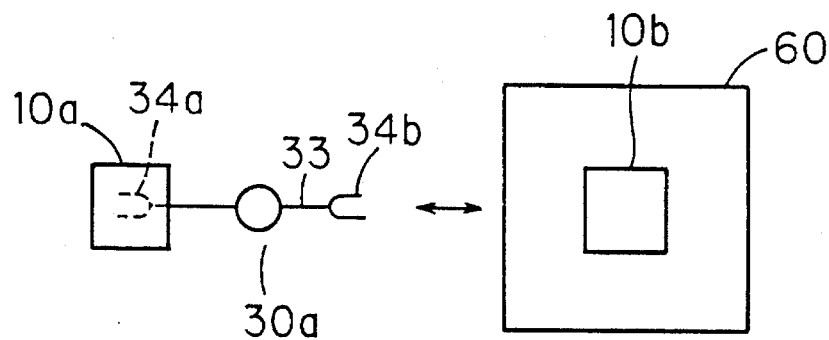

FIGS. 7A to 7C are schematic plan views showing the operation of the handler 30a. The substrate 10a in processing unit 60 is removed therefrom by handler 30a while another substrate 10b is delivered to the same processing unit 60 by means of the handler 30a. The processing unit 60 represents one of the aforementioned processing units SS, SC, . . . .

Referring to FIG. 7A, the substrate 10b is held by the second finger 34b while the substrate 10a is present in the processing unit 60. The arm 33 is moved in the (+Y) direction with the second finger 34b holding the substrate 10b and then takes the substrate 10a out of the processing unit 60 by using the first finger 34a and moving arm 33 in the (−Y) direction.

Referring to FIG. 7B, the arm 33 is rotated until the second finger 34b faces the processing unit 60. Thereafter, the arm 33 is moved in the (+Y) direction with the substrate 10b held by the second finger 34b being inserted into the processing unit 60, as shown in FIG. 7C.

It is understood from FIG. 7C that the substrate 10b is held by the handler 30a. If the handler 30a moves to the next processing unit, the above operation can be repeated. Thus, in the case where the apparatus has a plurality of processing units, the substrates can be sequentially transferred to each processing unit by using the handler.

<A-5. Processing in the First Sub-system A>

Table 1 below shows a series of processing steps carried out in the apparatus 1 of the embodiment. The respective processing steps, listed in section "A" of Table 1, are carried out by the corresponding processing units which are in column "APPARATUS".

TABLE 1

| SEC | PROCESSING | APPARATUS | TEMP. (°C.) | TIME (SEC.) |
|---|---|---|---|---|
| A | SPIN SCRUBBING | SS | | |
| | BAKE FOR DEHYDRATION | HP1 | 90 | 50 |
| | BAKE FOR DEHYDRATION | HP2 | 90 | 50 |
| | COOLING | CP1 | 30 | 50 |
| | BAKE FOR DEHYDRATION | HP3 | 80 | 50 |
| | COOLING | CP2 | 23 | 50 |
| | SPIN COATING | SC | | |
| | EDGE RICING | ER | | |
| | PRE-BAKE | HP4 | 100 | 50 |
| | PRE-BAKE | HP5 | 100 | 50 |
| | PRE-BAKE | RP6 | 100 | 50 |
| | COOLING | CP3 | 23 | 50 |
| | EXPOSING | ST | | |
| B | EDGE EXPOSING | ET | | |
| | POSTBAKE | HP7 | 140 | 50 |
| | POSTBAKE | HP8 | 140 | 50 |
| | POSTBAKE | HP9 | 140 | 50 |
| | COOLING | CP4 | 23 | 50 |
| | DEVELOPING | SD1 (SD2) | | 100 |

Figure 8:
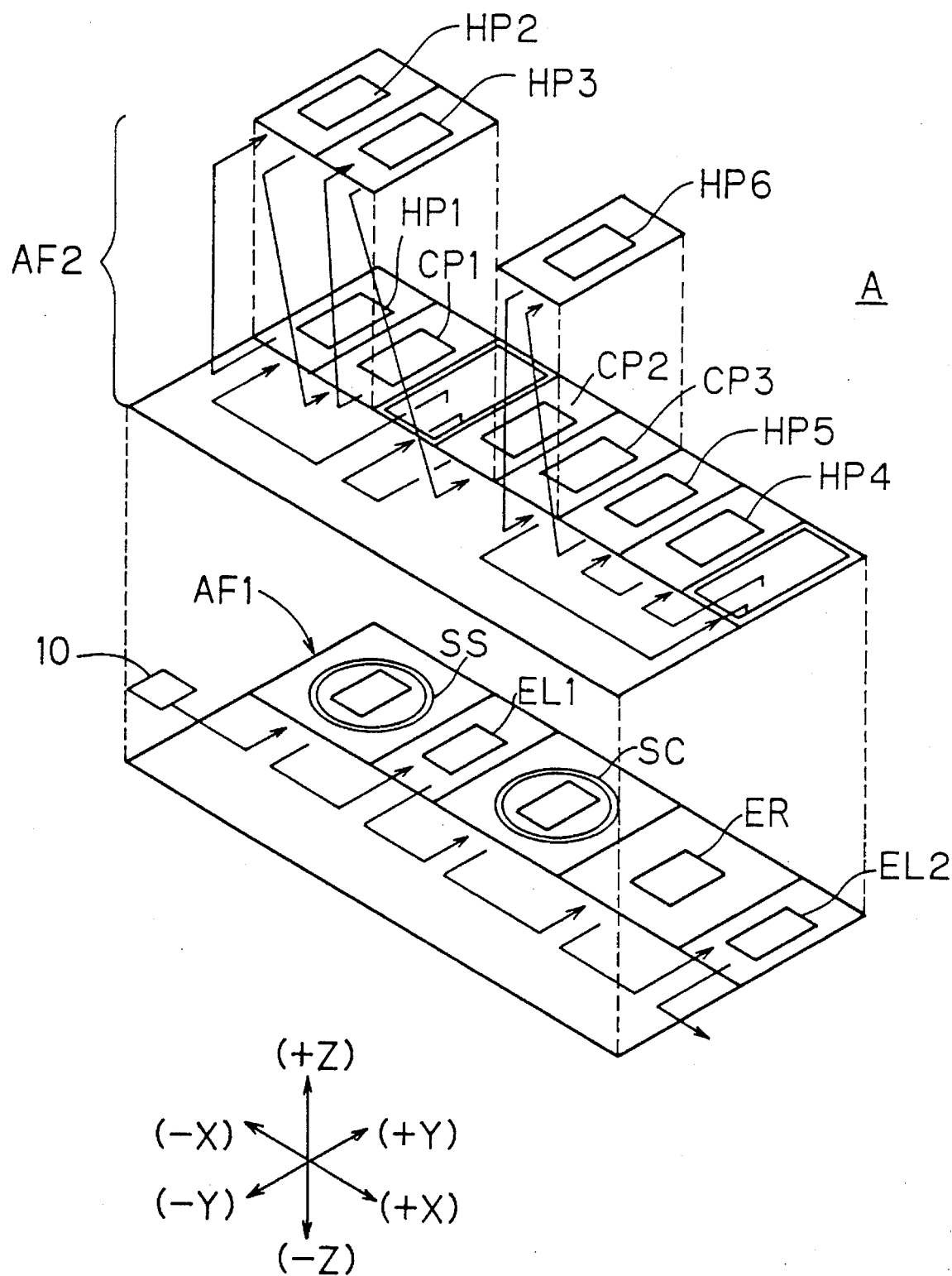
FIG. 8 is a perspective showing flow of a substrate in the first sub-system.

In FIG. 8, a flow of the substrate is indicated by the arrows. The flow will be now explained with reference to FIGS. 2 and 8 and Table 1.

First, the substrate 10 is inserted into the spin scrubbing device SS of the first stage AF1 by handler 30a. The substrate 10 that has been subjected to the spin scrubbing treatment by the spin scrubbing device SS is transferred to the elevator EL1 by the handler 30a. Upon receiving the substrate 10, the elevator EL1 goes up to the second stage AF2 with the substrate 10 being held therein.

The substrate 10 is carried from the elevator EL1 by the handler 30c in the second stage AF2, and then transferred to the hot plates HP1 and HP2 in that order, to be subjected to the heat processing by the respective hot plates HP1 and HP2. Thereafter, the substrate 10 is transferred by the handler 30c to cool plate CP1 to be subjected to the cooling processing.

The substrate 10 is transferred to the next hot plate HP3 and the cool plate CP2 by the handler 30c. The heat processing may be changed into the coating processing in which an adhesion-strengthening agent for resist film is applied. A suitable adhesion-strengthening agent is HMDS hexamethyldisilazane.

When the above process has been completed, the substrate 10 is transferred to elevator EL1 by the handler 30c. Thereafter, the elevator EL1 goes down to the first stage AF1 with the substrate 10 being held therein.

The substrate 10 is delivered by the handler 30b into the spin coating device SC and the edge and back removing part ER sequentially. The resist coating treatment is carried out in the spin coating device SC, and thereafter the edge and back rinsing treatment is carried out in the edge and back removing part ER. Upon completion of the above treatments, the substrate 10 is transferred to the elevator EL2 by the handler 30b. The elevator EL2 goes up to the second stage AF2 with the substrate 10 being held therein.

The substrate 10 is taken out of the elevator EL2 by means of the handler 30d. For the purpose of conducting the preliminary bake treatment, the substrate 10 is sent to the respective hot plates HP4 to HP6 one after another, in that order, and then the substrate 10 that has been subjected to the preliminary bake treatment is inserted into the cool plate CP3 to be subjected to the cool processing. Thereafter, the substrate 10 is transferred to the elevator EL2 by the handler 30d. The elevator EL2 goes down to the first stage AF1 with the substrate 10 being held therein. The substrate 10 is taken out of the elevator EL2, and then sent to the buffer part 6 (in FIG. 1) by the handler 30b.

<A-6. Processing in Second Sub-system B>

Now referring to FIG. 9, wherein a flow of the substrate in the second sub-system B is indicated by arrows. The series of processing steps is described in section "B" of Table 1. The flow will be now explained with reference to FIGS. 4 and 9 and Table 1.

The substrate 10, subjected to processing in the exposing machine 5 of FIG. 1 and the supplementary exposing part 7, is picked up by the handler 30e to be transferred to the elevator EL3. The elevator EL3 goes up to the second stage AF2, and then the substrate 10 is transferred to the handler 30f which delivers the substrate 10 to the hot plates HP7 to HP9 in that order.

It is understood from Table 1 that the postbake processing is carried out for 50 seconds in the hot plate HP9. If the postbake processing in the hot plate requires a processing time of more than 50 seconds, the odd substrate in the processing series may be inserted into the hot plate HP9 while the even substrate in the processing series may be inserted into the hot plate HP10 provided on the upper layer.

The baked substrate 10 is inserted into the cool plate CP4 to be cooled, and then transferred to the elevator EL4 by the handler 30e. The elevator EL4 goes down to the first stage BF1, so that the substrate 10 in the elevator EL4 is delivered to the handler 30e and the substrate 10 is transferred to the spin developing device SD1 or SD2 by the handler 30e. Since the time required for developing the resist film provided on the inserted substrate 10 is 100 seconds, the odd substrate in the processing series is inserted into the first spin developing device SD1 while the even substrate in the processing series is inserted into the second spin developing device so that the total time required for spin developing processing is constant.

The developed substrate 10 is taken out of the spin developing device SD1 or SD2 and transferred to the unloading station 8 of FIG. 1 by the handler 30e.

The series of operation is automatically controlled by means of the cooperation between a control circuit and driving devices.

<A-7. Advantages of Substrate Processing Apparatus 1>

The substrate processing apparatus 1 having the above structure and operation has the following advantages:

(a) Since the processing units are arranged in a multistage configuration, the floor area for and the height of the apparatus 1 are reduced, facilitating set-up and operation for the apparatus 1.

(b) Since the handlers 30a to 30f can be approached easily from the outside, the inspection and the maintenance for the apparatus are facilitated.

(c) Since the plurality of processing units are arranged in a matrix, the substrate can be taken into and out of the respective processing units randomly.

For example, in the first sub-system A of the above embodiment, strokes for movement of the respective handlers 30a to 30d are the follows:

handler 30a; the stroke between the loading position for the substrate 10 and the elevator EL1 in the first stage AF1, handler 30b; the stroke between the elevators EL1 and EL2 in the first stage AF1, handler 30c; the stroke between the hot plate HP1 or HP2 and the cool plate CP3 in the second stage AF2; and handler 30d; the stroke between the hot plate HP6 and the elevator EL2 or between the cool plate CP3 and the elevator EL2 in the second stage AF2. These strokes scarcely overlap each other. Although the strokes for the handlers 30a and 30b overlap at the elevator EL1, the amount of overlapping is a negligible quantity with respect to the size of the whole apparatus.

This allows handles 30a to 30d to move without interfering with each other, in that movements of the handlers 30a to 30d can be controlled individually. Accordingly, the process order for the substrate 10 in the first sub-system A can be changed from the above process order. For the same reason, the process order in the second sub-system B can be changed, similarly.

(d) Since the floors 42 and 52 are provided in front of the processing units, scattering of particles from one stage to another stage is prevented.

(e) The corresponding down or oblique flows of the clean air for the respective stages prevent particles from the transferring mechanism from contaminating the substrate.

(f) In the apparatus 1, the handlers for transferring the substrate are provided in each stage while the elevators for transferring the substrate are provided therebetween. Accordingly, the substrates can be moved in parallel and individually, to thereby improve throughput.

<A-8. Modifications of First Embodiment>

(1) The first and second sub-systems may be arranged in a straight line.

(2) The substrate may be transferred by means of a transferring mechanism comprising a single transferring device which can transfer the substrate in both horizontal and vertical directions and which will be described the later, instead of by means of individual devices for horizontal and vertical transfers.

(3) The plurality of processing units may be stacked in three or more stages.

(4) The stages in the embodiment include the processing units in either single or double layers. The stage may comprise three or more layers thereof. The number of layers in each stage may be optionally determined on the basis of the process and the heights of the respective processing units. In the case where processing units that are lower in height, such as hot plates, or cool plates are provided, floor area can be saved by stacking such processing units.

(5) It is particularly desirable for minimizing size of the whole apparatus that the arrangement of the processing units is determined so that the lengths of the first and second stages in the X direction are identical to each other. However, the concept of the present invention can be applied to apparatus in which the length of the second stage in the X direction is shorter than that of the first stage.

(6) The apparatus may optionally define whether or not the process in the first stage has priority over the process in the second stage. The number and arrangement of elevators may be changed as found to be appropriate. Referring to FIG. 9, for example, the elevator EL4 may be omitted and all the substrates may be transferred between the first and second stages by means of the elevator EL3.

(7) The elevator can function as a cool plate. More precisely, the substrate may be cooled during the whole time it is on the elevator.

(8) The kind of processing units may be defined on the basis of the kind of substrate and process required.

(9) Although the processes in the respective processing units are exemplified in Table 1, the former may be changed optionally. For example, the heating time required in the hot plates HP4 to HP6 can be different from that shown in Table 1. The next substrate may be subjected to heat treatment by means of one hot plate not having the substrate in place of heat treatment by means of the three hot plates HP4 to HP6 in which the substrate is introduced in this order.

(10) The present invention can be applied to the substrate processing apparatus for processing substrates such as semiconductor wafers or the like, as well as the apparatus for processing the substrates of liquid crystal displays.

B. Device for and Method of Exchanging Substrate in Substrate Processing Apparatus <B-1. Overall Structure of Substrate Processing Apparatus>

Figure 10:
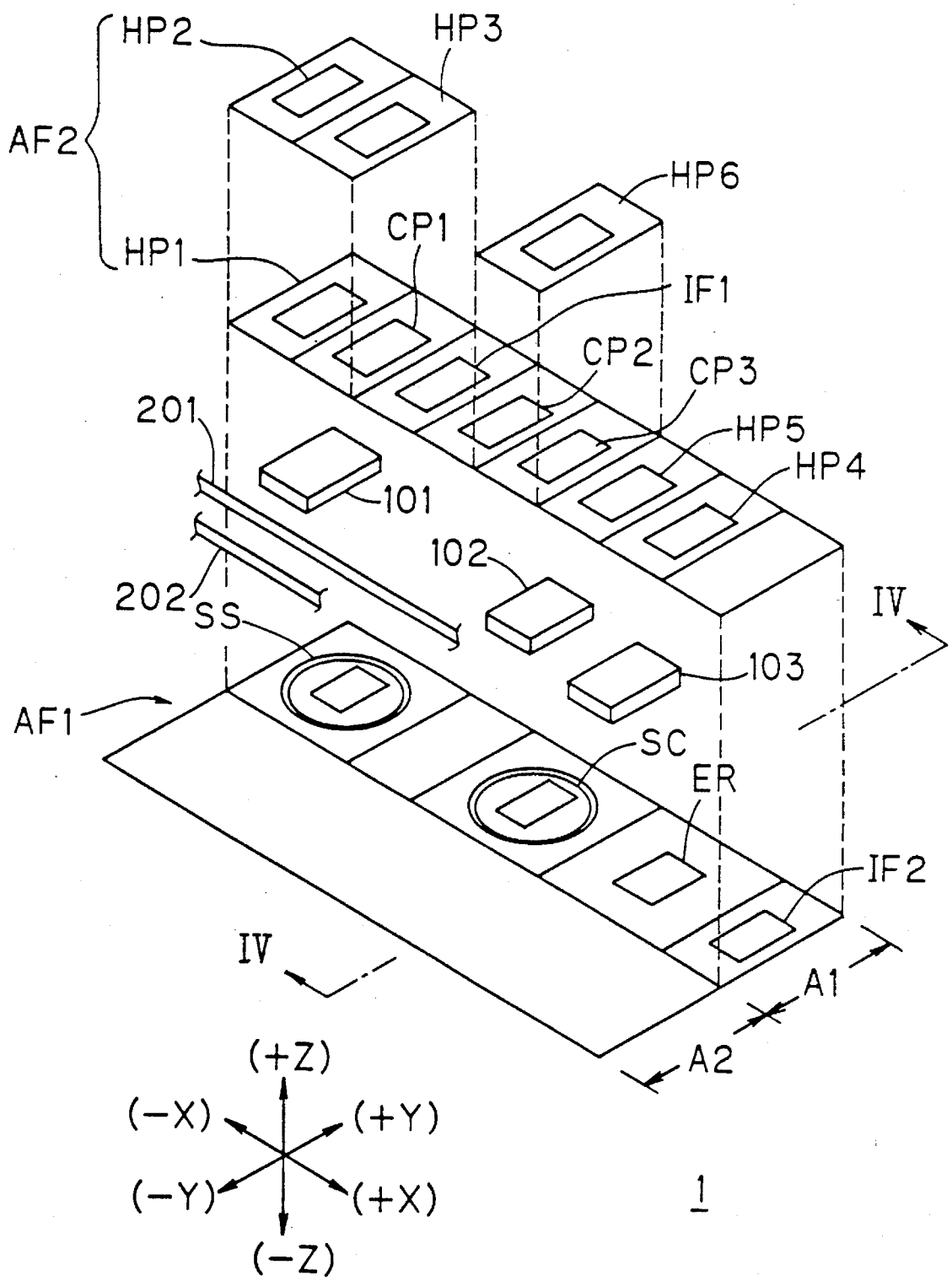
FIG. 10 is a perspective of a substrate processing apparatus including a substrate exchanging device constructed according to the present invention.
Figure 11:
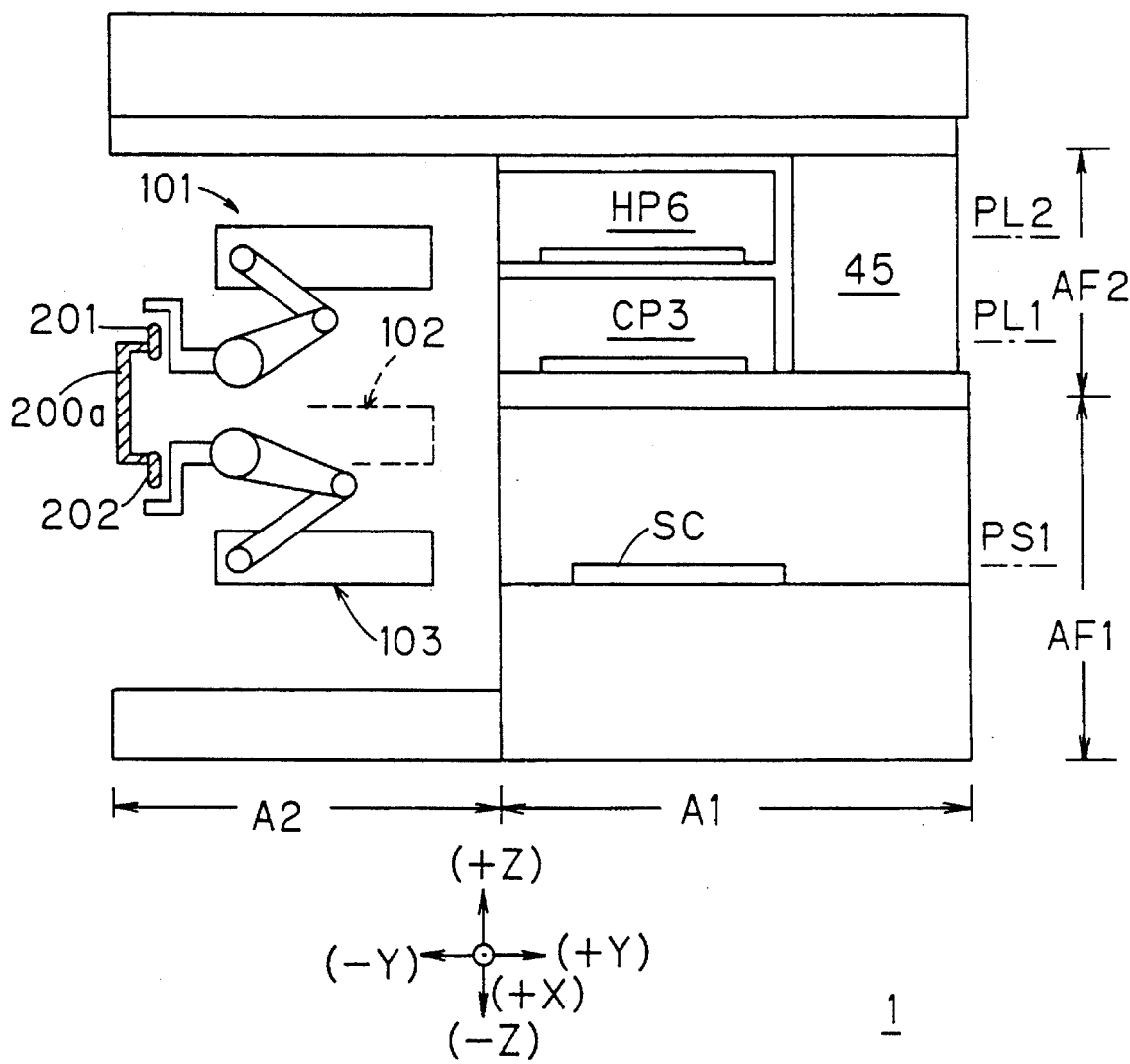
FIG. 11 is a side view looking in the (−X) direction along line XI–XI of FIG. 10.

In connection with the arrangement illustrated in FIGS. 10 and 11, substrate processing apparatus 1 acts as an apparatus for coating photo-resist for use in forming patterns such as electrodes on a surface of a liquid crystal display substrate.

In FIGS. 10 and 11 substrate processing apparatus 1 comprises a sub-system A1 in which there are a plurality of processing units in multi-stage arrangement. In the sub-system A1, the spin scrubbing device SS, the spin coating device SC and the rinsing part ER are disposed in the X direction, to thereby form a first stage AF1. There is an interface part IF2, on which the substrate can be introduced to the first stage.

A second stage AF2 is arranged above the first stage AF1. The second stage AF2 has a two-layer structure, more precisely, a first layer consisting of hot plates HP1, HP4, HP5 and cool plates CP1 to CP3 which are arranged in the X direction; and a second layer consisting of hot plates HP2, HP3 and HP6. As shown in FIG. 11, the corresponding units in the first and second layers, for example the cool plate CP3 and the hot plate HP6, are stacked. There is an interface IF1, on which the substrate can be introduced to the first layer. As described above, the apparatus 1 has the first stage AF1 with the single layer and the second stage AF2 with the two layers, so that a two stage and three layer structure is formed.

There is a frame 200a in front of the processing part A1, i.e., in the (−Y) side, the frame 200a expanding in the X direction. The frame 200a is disposed at substantially center in height between a pass line PS1 for taking the substrate in and out of the spin coating device SC and a height level PL2 for taking the substrate in and out of the upper processing unit HP6, as shown in FIG. 11. Two parallel guide rails 201 and 202 extending in the X direction are secured on the frame 200a with a predetermined distance in the Z direction. A substrate transferring device 101 is connected to the upper guide rail 201 to move along the guide rail 201 in the X direction, although the connection between the substrate transferring device 101 and the guide rail 201 is omitted in FIG. 10. Two substrate transferring devices 102 and 103 are connected to the guide rail 202 to move along the guide rail 202 in the X direction. These substrate transferring devices 101 to 103 transfer the substrate among all of the processing units. The structure of devices 101–103 will be more fully described later.

<B-2. Structure of Substrate Transferring Device>

Since the substrate transferring devices 101 to 103 in FIG. 11 are identical in basic structure to each other, the following description will now be focused on the structure of the substrate transferring device 101.

<B-2-1. Whole Structure>

Figure 13:
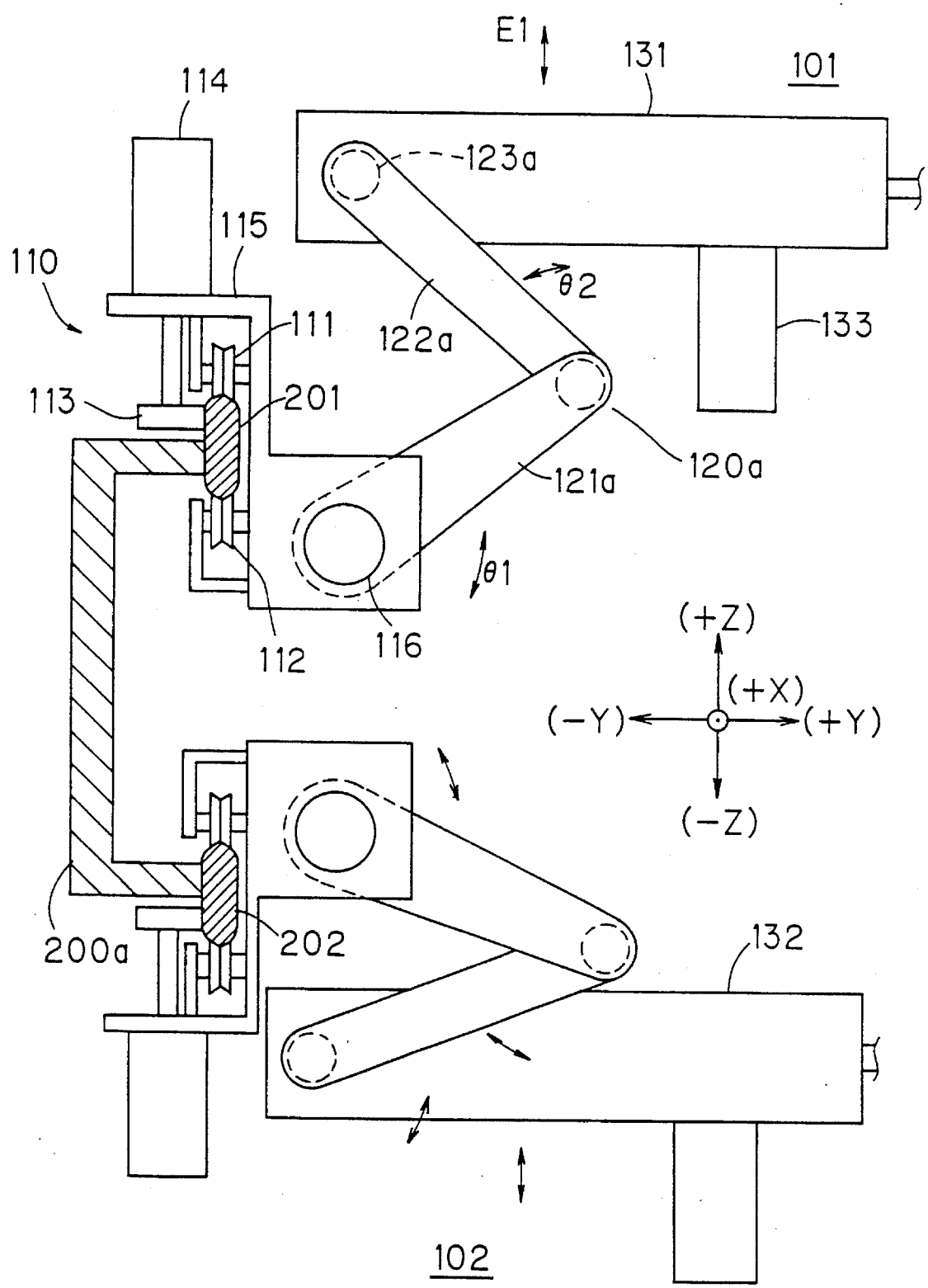
FIG. 13 is a side elevation of the substrate transferring device looking in the direction of the arrow VII in FIG. 12.

Referring to FIG. 13, the first substrate transferring device 101 is connected to the upper guide rail 201 secured on the frame 200a. The substrate transferring device 101 comprises a X moving mechanism 110 for moving the whole substrate transferring device in the X direction. A vertical arm mechanism 120a, for stretching (extending) and withdrawing in the vertical direction Z, is connected to the X moving mechanism 110. The vertical arm mechanism 120a supports a hollow housing 131 which is open at each end thereof as viewed in the Y direction. A horizonal arm mechanism 140, which can be stretched (extended) and withdrawn in the horizontal direction Y, is fixed at a location within housing 131. A pair of hands 150a and 150b are secured to the leading edge portion of the horizontal arm mechanism 140.

<B-2-2. X Moving Mechanism 110>

Referring to FIG. 13 again, the X moving mechanism 110 comprises rollers 111 and 112 sandwiching the guide rail 201 along the Z direction. In the mechanism 110, a driving roller 113 is connected to a motor 114 supported by a supporting member 115. Upon being driven by the motor 114, the X moving mechanism 110 moves along the guide rail 201, so that the substrate transferring device 101 is moving in the X direction.

<B-2-3. Vertical Arm Mechanism 120a>

A motor 116 is fixed below the supporting member 115. The vertical arm mechanism 120a comprises two arms 121a and 122a which are substantially of the same length. One end portion of the arm 121a is connected to the motor 116 while one end portion 123a of the arm 122a is connected to the housing 131. The vertical arm mechanism 120a is a scalar robot mechanism. Upon being driven by the motor 116, the arms 121a and 122a pivot as indicated by the arrows θ1 and θ2, respectively, so that the housing 131 moves along the Z direction in a predetermined path, as indicated by arrow E1. When the rotary direction of the motor 116 is switched, the moving direction of the housing 131 is reversed, more precisely changed from the (+Z) direction into the (−Z) direction or from the (−Z) direction into the (+Z) direction.

Figure 14:
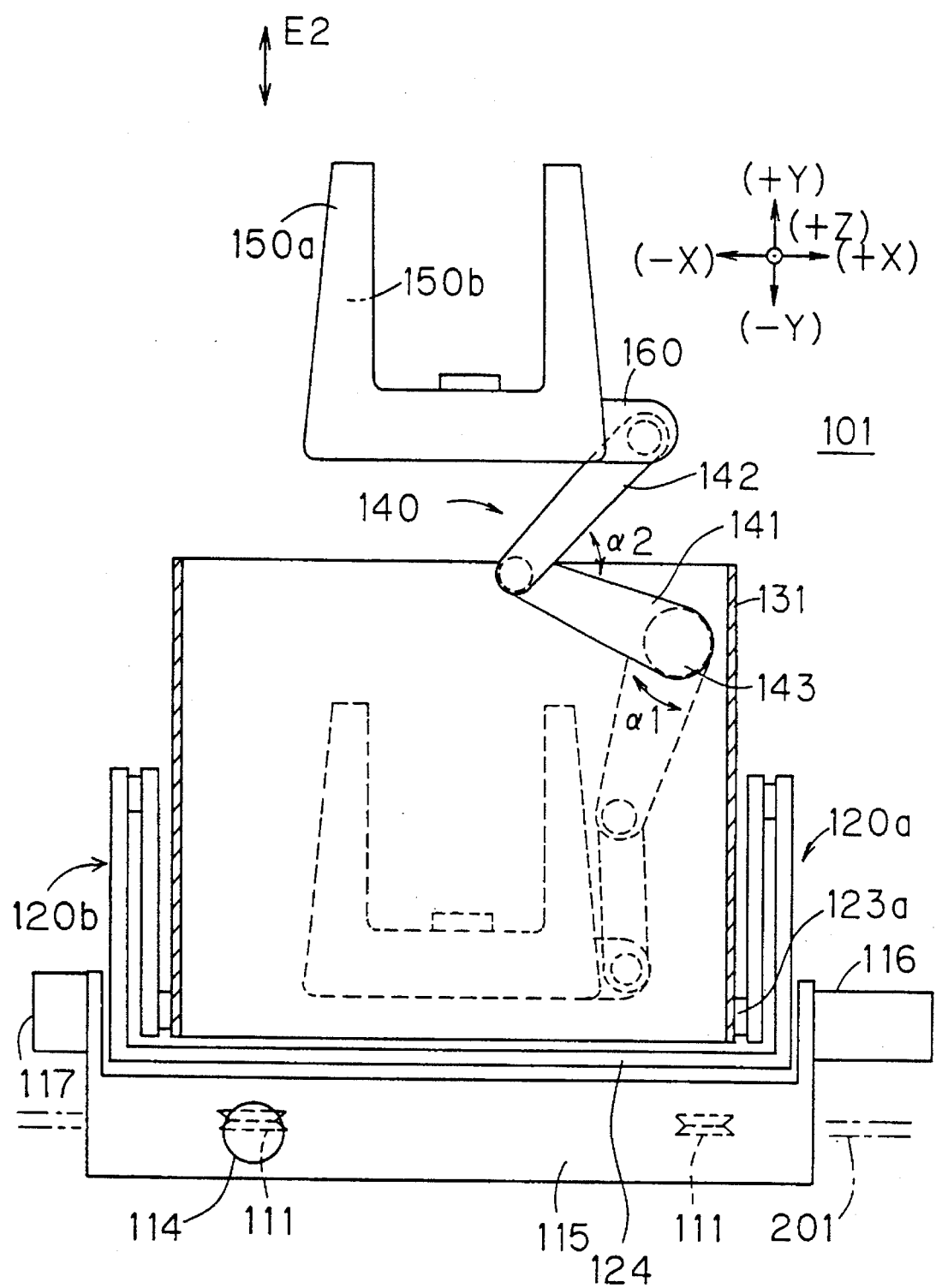
FIG. 14 is a plan view of the substrate transferring device looking in the direction of the arrow VIII in FIG. 12.
Figure 15:
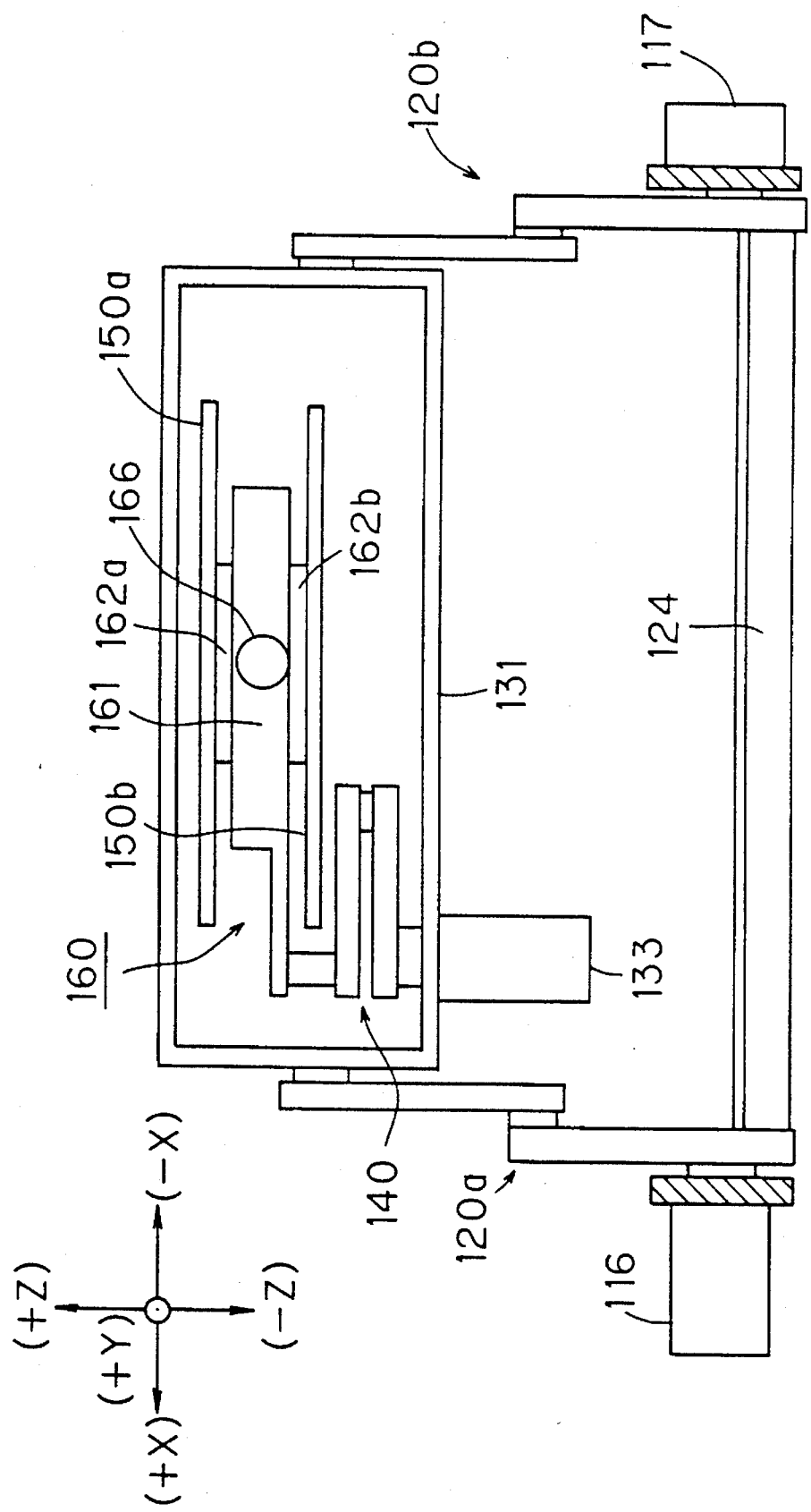
FIG. 15 is a front elevation of the substrate transferring device looking in the direction of the arrow IX in FIG. 12.

As shown in FIG. 14, the other vertical mechanism 120b, having a construction identical to that of the vertical mechanism 120a, is provided on the opposite side of the housing 131. These vertical mechanisms 120a and 120b are connected to each other by a connecting member 124 extending in the horizontal direction X. Thus, the driving force of the motor 116 is transmitted to the vertical arm mechanism 120b through the connecting member 124, the result being that the arms in the vertical arm mechanism 120b pivot at the same time that the respective arms in the vertical arm mechanism 120a rotate, so that corresponding arms in the vertical arm mechanisms 120a and 120b pivot to the same extent. Accordingly, the housing 131 supported by the vertical arm mechanisms 120a and 120b moves in the Z direction in a predetermined position. A torque spring 117 is provide in the vertical arm mechanism 120b for balancing torque that is loaded by the motor 116 on the other vertical arm mechanism 120a.

The substrate transferring device 102 shown in FIG. 13 is substantially identical in structure to the substrate transferring device 101. That is, devices 101 and 102 have the same construction for the housings and internal elements, except that the X moving mechanisms and the vertical arm mechanisms each have a construction symmetrical with respect to the Z direction.

The respective housings provided in the substrate transferring devices 101 to 103 can move from the pass line PS1 (see FIG. 11) to the height level PL2 for taking the substrate in and out of the hot plate HP6.

<B-2-4. Horizontal arm mechanism 140>

FIG. 14 is a plan view of the housing 131, with its upper or ceiling surface cut away for the sake of clarity. One end portion of the horizontal arm mechanism 140 is provided in and connected to the housing 131. The horizontal arm mechanism 140 comprises two arms 141 and 142 which are of substantially the same length. One end portion 143 of the arm 141 is pivotally supported by the housing 131 and connected to a motor 133 (see FIGS. 12 and 13). The lead edge portion of the second arm 142 is connected to the hands 150a and 150b.

The horizontal arm mechanism 140 is also a scalar robot mechanism. Upon being driven by the motor 133, the hands 150a and 150b move in the (+Y) direction, to reach the processing unit. If the driving shaft of the motor 133 reverses, the hands 150a and 150b move in the (−Y) direction, to retract them for storage within the housing 131.

<B-2-5. Space controlling mechanism 160>

Figure 12:
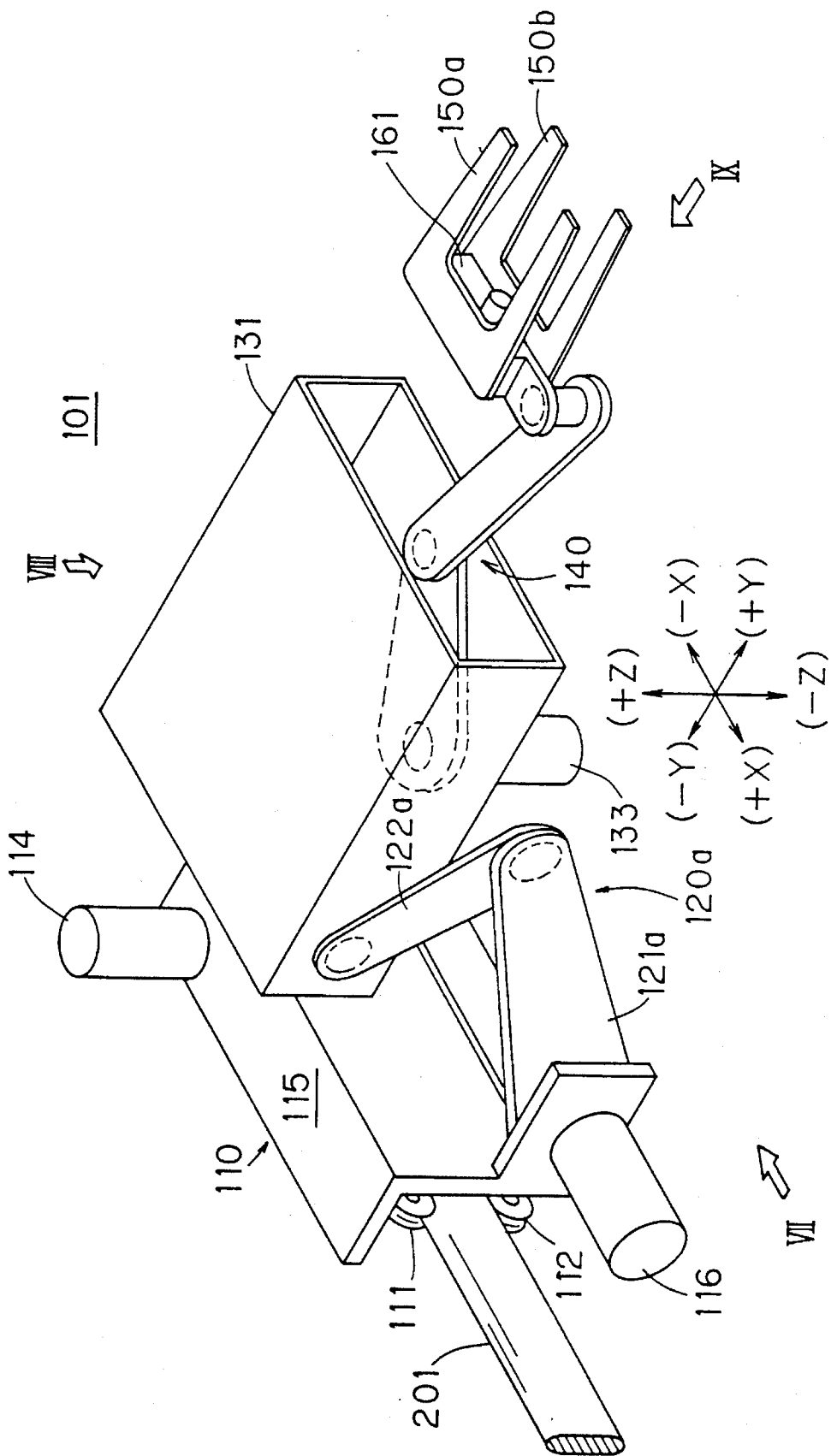
FIG. 12 is a perspective of the substrate transferring device of FIG. 11.

As shown in FIGS. 12 and 14, each of the hands 150a and 150b is a plate with two fingers. The substrate is put on the hand 150a or 150b, and then transferred to the processing unit with the hands 150a and 150b being stored with the housing 131.

Figure 16:
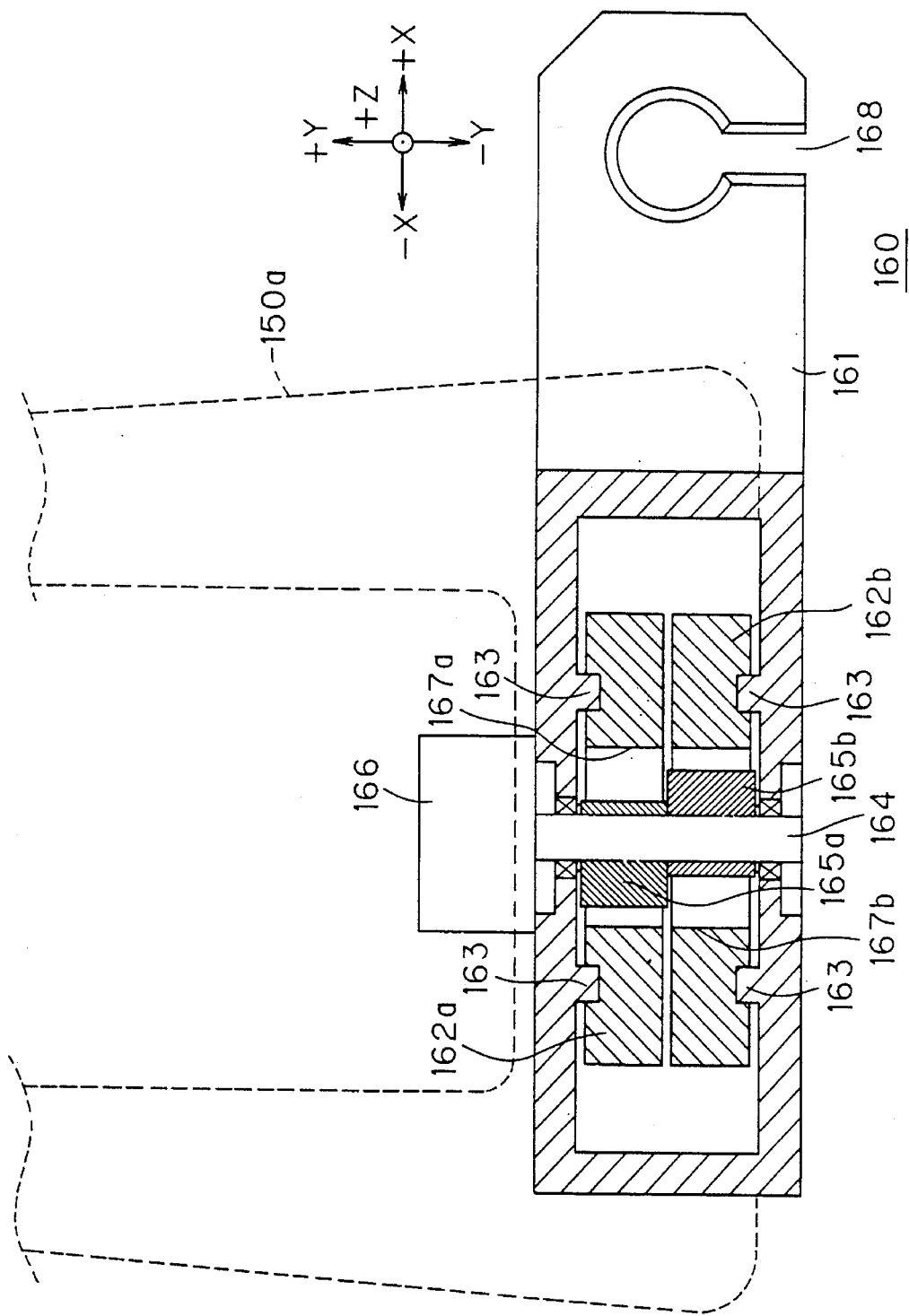
FIG. 16 is a sectional plan view of a space controlling mechanism taken in the (–Z) direction.

The hands 150a and 150b are connected to the lead edge portion of the arm 142 by the space controlling mechanism 160. FIG. 16 is a plan sectional view of the space controlling mechanism 160 taken in the (−Z) direction. The space controlling mechanism 160 comprises a body 161 having a through hole 168 which is connected to the lead edge portion of the arm 142. The body 161 is provided with four rails 163 that extend vertically. Two sliding blocks 162a and 162b are slidably connected to the rails 163. The hands 150a and 150b are fixed to the sliding blocks 162a and 162b respectively. An air cylinder 166, which can be driven by compressed air, is attached to the body 161 to drive a driving shaft 164 on which eccentric cams 165a and 165b are secured.

Figure 17:
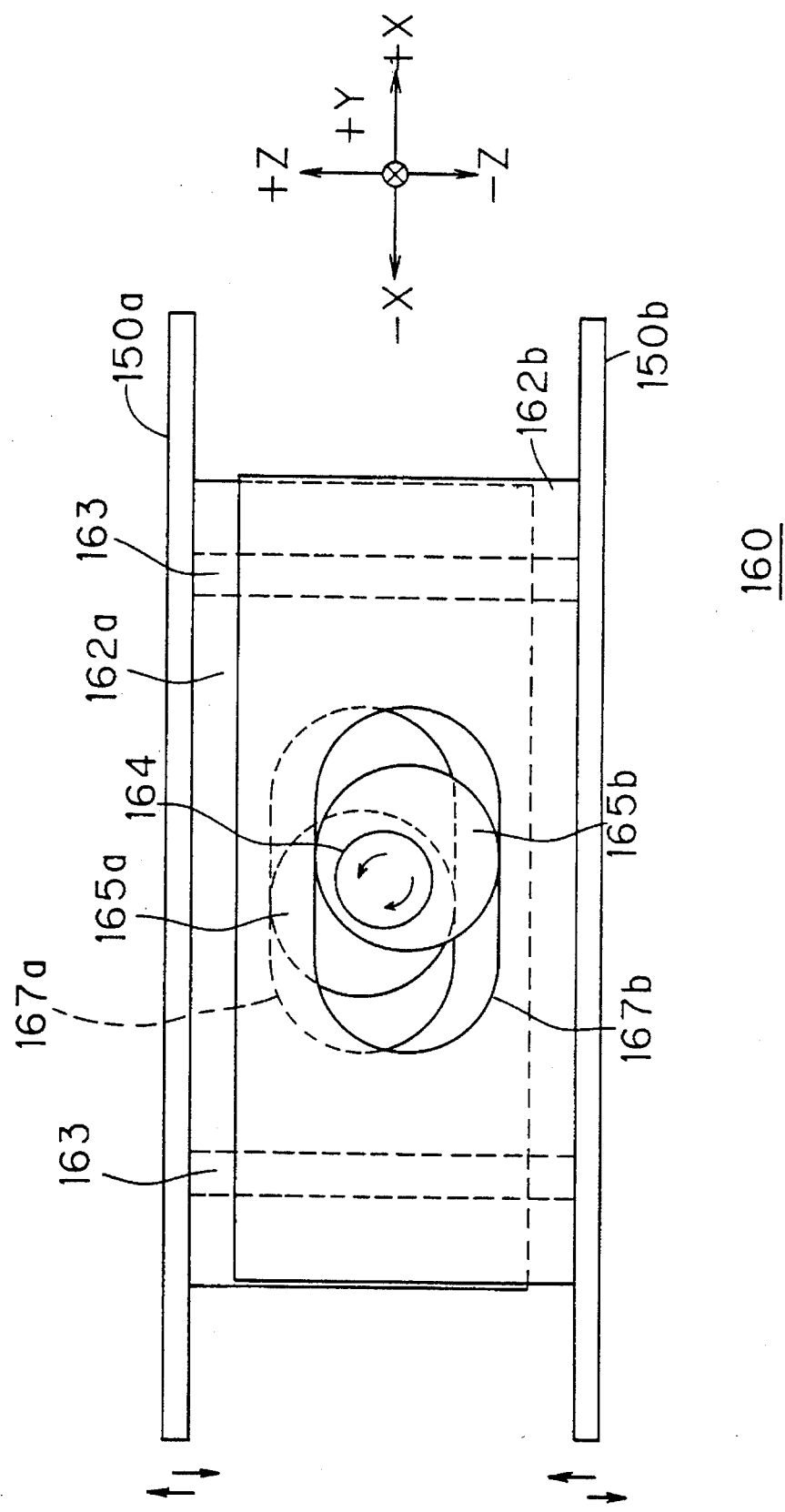
FIG. 17 is a front view of the space controlling mechanism taken in the (+Y) direction, with portions broken away for the sake of clarity.

FIG. 17 is a front view of the space controlling mechanism 160 taken in the (+Y) direction, with portions broken away for the sake of clarity. Guide through holes 167a and 167b, which have internal side surfaces parallel to each other, are provided in the sliding blocks 162a and 162b, respectively, to be guided by the movement of the eccentric cams 165a and 165b. The pair of eccentric cams 165a and 165b are eccentrically arranged in the opposite side across the driving shaft 164. Thus, when the driving shaft 164 rotates, the eccentric cams 165a and 165b push up the one of the sliding blocks 162a and 162b and push down the other. In other words, upon being driven by the air cylinder 166, the hands 150a and 150b connected to the sliding blocks 162a and 162b move in the Z direction, so that the space between the hands 150a and 150b can be changed.

Figure 18:
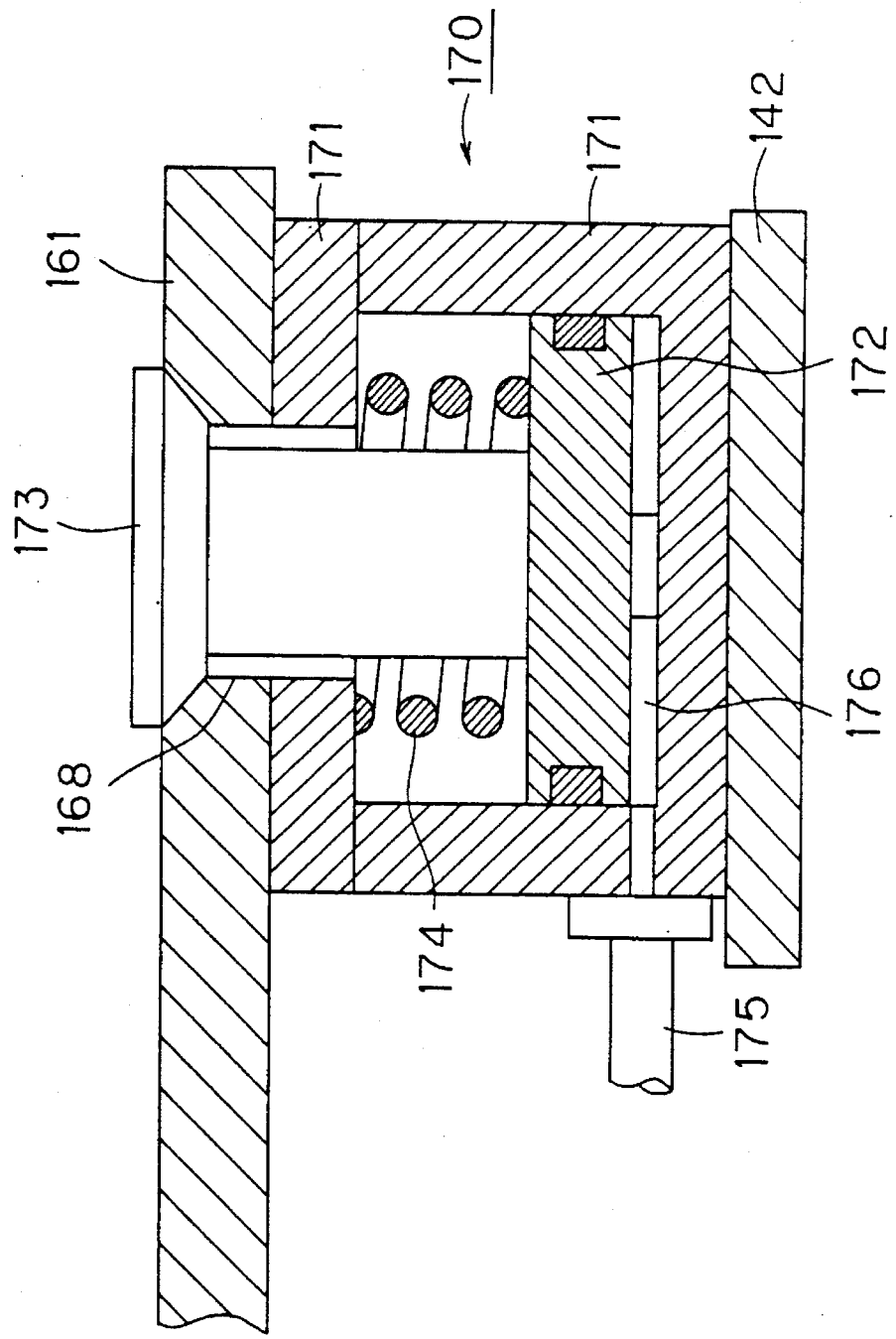
FIG. 18 is a detail view of portions connected between an arm in FIG. 16 and a body.

FIG. 18 is a detail view of portions connected between the arm 142 and the body 161, illustrating a sectional view of the attachment mechanism 170 that is between the body 161 and the arm 142. The attachment mechanism 170 comprises a hollow body 171 having a recess in which a piston 172 is provided so as to slide along the internal side surface thereof with an airtight condition. A pushing member 173 is fitted to the piston 172. In the recess of the body 171, a compressed spring is stored to bias against the piston 172 and the pushing member 173 downwardly. The pushing member 173 is inserted into the through hole 168 in the body 161 by the downwardly biasing force, so that the body 161 and the arm 142 are connected to each other. Hence, when compressed air is introduced through an air transporting tube into an air room 176 formed by the inner wall of the body 171 and piston 172, the piston 172 is pushed up against the downwardly biasing force of the spring 174, so that the pushing member 173 rises to the through hole 168. The pushing member 173 rising in the through hole 168 permits member 173 to be attached into and deattached out of the through hole 168 since a notch is provided in the through hole 168 as shown in FIG. 16. Accordingly, body 161 and the arm 142 are easily attached and deattached by means of the attachment mechanism 170.

<B-3. Operation of Substrate Transferring Device>

FIGS. 19A to 19D are schematic diagrams showing the operations for taking substrate 10 into and out of a processing unit 300, such as a hot plate HP. Upper and lower substrate holding mechanisms 310a and 310b are provided in the processing unit 300 so that the substrate 10 is transferred between an exchange position for exchanging a processed substrate for a next substrate and a treatment position where the predetermined processing is carried out. The space between the hands 150a and 150b can be controlled by means of the air cylinder 166 in the space controlling mechanism 160. Thus, the space therebetween is controlled so as to be wider or narrower than the space between the substrate holding mechanisms 310a and 310b.

A processed substrate 10a which has been processed by the processing unit 300 is put on the upper substrate holding mechanism 310a. A next substrate 10b, which should be processed next by the processing unit 300, is put on the lower hand 150b, the next substrate 10b having been processed by other processing unit for achieving the preliminary treatment prior to processing in the specified processing unit 300. The substrate transferring device 101 in which the next substrate 10b is put on the lower hand 150b moves in the X and Z directions, and then stops in front of the processing unit 300, so that the lower hand 150b is positioned vertically at the center between both of the substrate holding mechanisms 310a and 310b. During the above movement, the hands 150a and 150b are stored within the housing 131 while the space therebetween is narrower than the space between both of the substrate holding mechanisms 310a and 310b (this is a "narrow state").

Figure 19A:
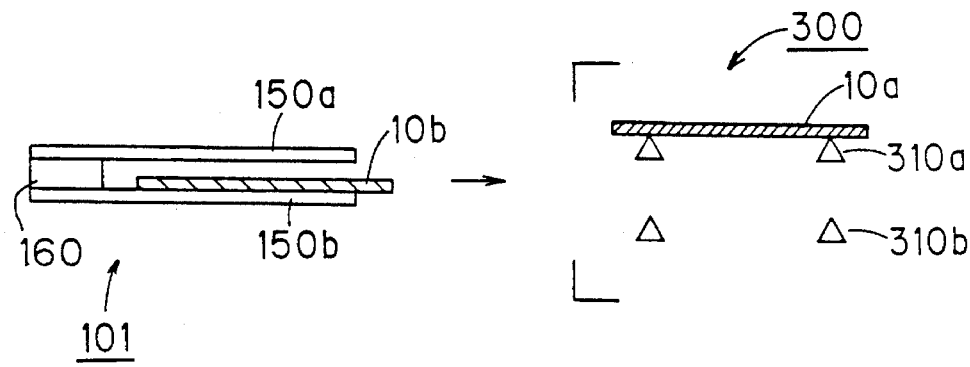
FIGS. 19A to 19D and 20A to 20D are schematics showing the operation of exchanging a processed substrate for another substrate.
Figure 19B:
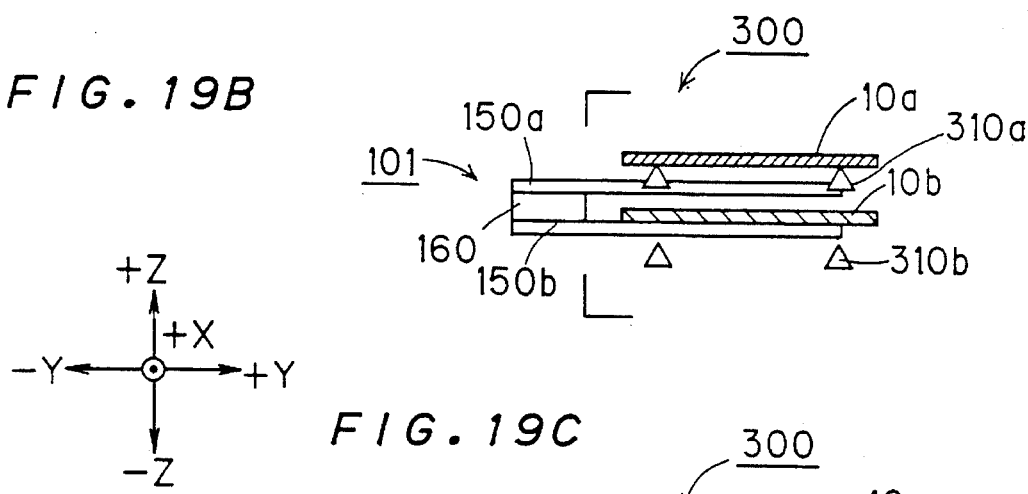

Next, the horizontal arm mechanism 140 is stretched in the (+Y) direction so that the hands 150a and 150b are inserted into the processing unit 300 till the hands 150a and 150b reach the position between the substrate holding mechanisms 310a and 310b. At this time, the upper hand 150a is located under the processed substrate 10a while the lower substrate holding mechanism 310b is located under the next substrate 10b, as shown in FIG. 19B.

Figure 19C:
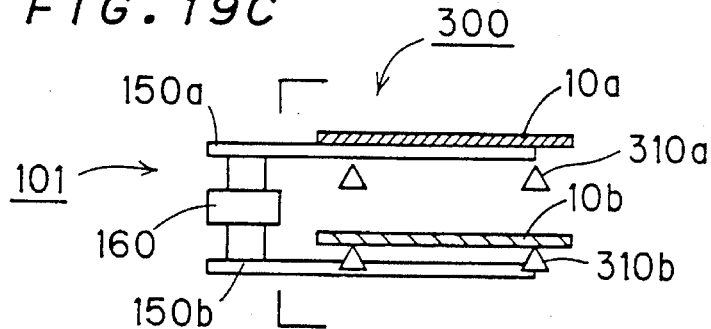

Thereafter, the space controlling mechanism 170 is operated, so that the hands 150a and 150b go up and down respectively (this is a "wide state"), and then stop when the hands 150a and 150b pass through the substrate holding mechanisms 310a and 310b, respectively (FIG. 19C). By means of the movement of the hands 150a and 150b, the processed substrate 10a is picked up by the upper hand 150a while the next substrate 10b is put on the lower substrate holding mechanism 310b. In other words, the processed substrate 10a is transferred from the upper substrate holding mechanism 310a to the upper hand 150a while the next substrate 10b is transferred from the lower hand 150b to the lower substrate holding mechanism 310b.

Figure 19D:
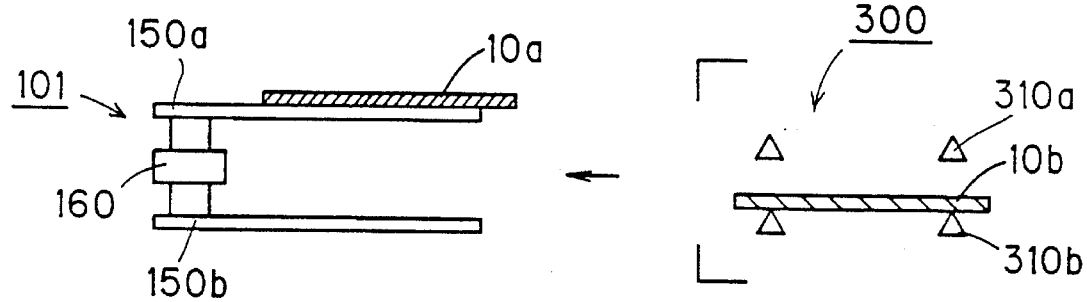

Next, the horizontal arm mechanism 140 is withdrawn in the (−Y) direction so that the hands 150a and 150b are stored within the housing 131, as shown in FIG. 19D. Then, the substrate transferring device 101 moves in the X and Z direction to transfer the processed substrate 10a to other processing unit in which the substrate 10a will be subjected to further processing. The next substrate 10b introduced into the processing unit 300 is transferred to the predetermined position in the processing unit 300 where the substrate is subjected to processing.

Figure 20A:
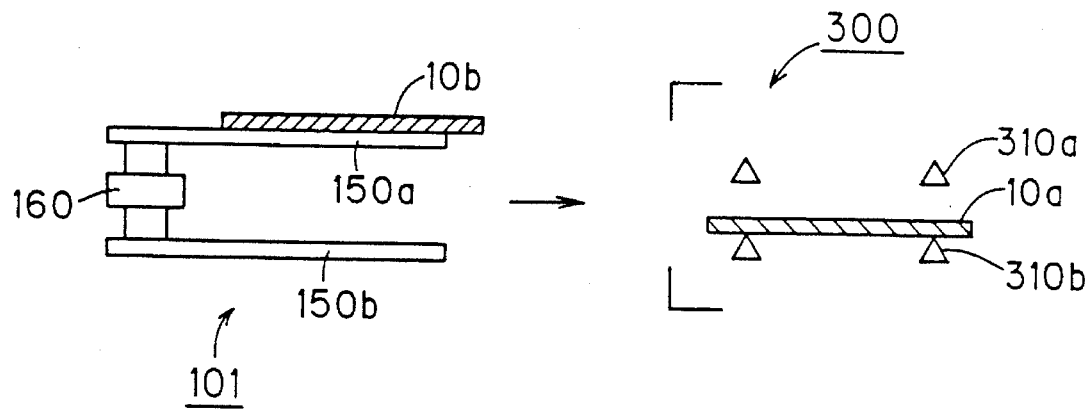
Figure 20B:
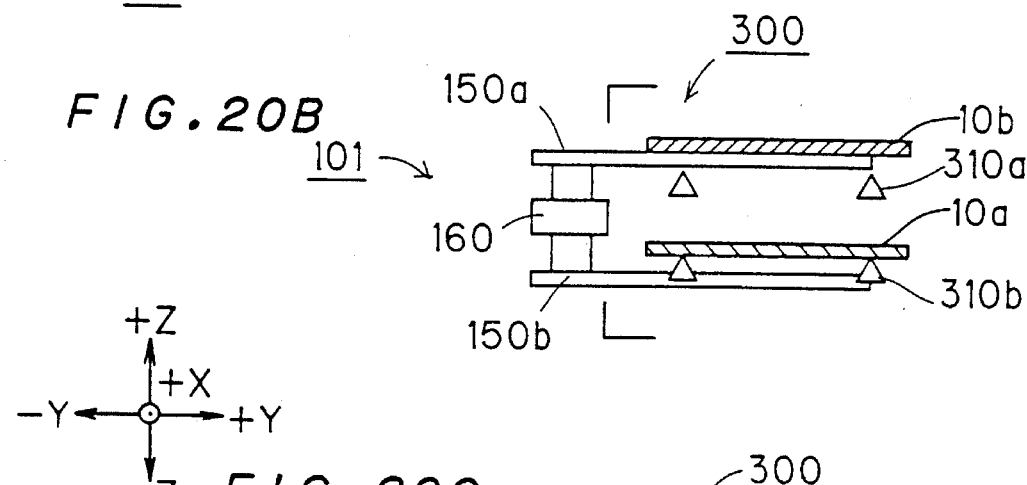
Figure 20C:
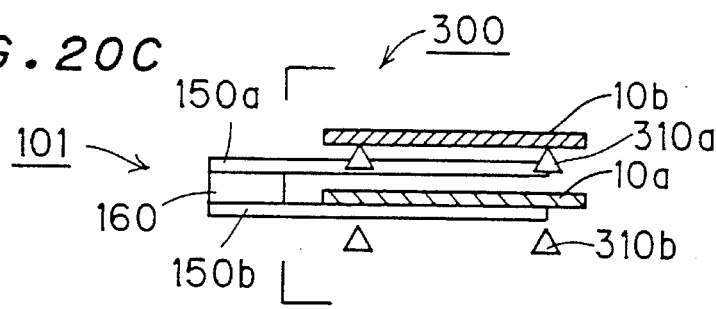
Figure 20D:
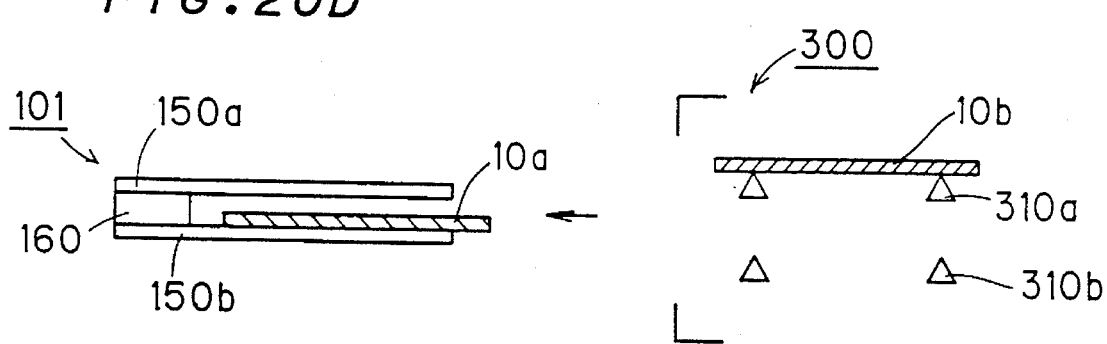

From FIGS. 20A to 20D, it is understood that positional relationship between the substrates 10a and 10b can be reversed. In this case, the processed substrate 10a, which must be taken out of the processing unit 300, is put on the lower substrate holding mechanism 310b while the next substrate 10b, which must be taken therein, is put on the upper hand 150a. The substrate transferring device 101 is brought to a position in front of the processing unit 300 in wide state (FIG. 20A). After stretching the horizontal arm mechanism 140 in the (+Y) direction to insert the hands 150a and 150b into the processing unit 300 (FIG. 20B), the respective hands 150a and 150b go down and up respectively to be in narrow state (FIG. 20C). By means of the movement of the hands 150a and 150b, the processed substrate 10a is picked up by the lower hand 150b while the next substrate 10b is put on the upper substrate holding mechanism 310a. In other words, the processed substrate 10a is transferred from the lower substrate holding mechanism 310b to the lower hand 150b while the next substrate 10b is transferred from the upper hand 150a to the upper substrate holding mechanism 310a. Upon completion of exchanging the processed substrate 10a for the next substrate 10b, the horizontal arm mechanism 140 is withdrawn in the (−Y) direction so that the hands 150a and 150b are stored within the housing 131 (FIG. 20D).

In the case where the substrate processing apparatus 1 comprises various kinds of processing units 300, the substrate 10 is transferred along the arrangement of the processing units 300 and is taken in and out of the processing unit 300 in predetermined order, so that a series of processing steps is carried out. The relationship in the vertical direction between the processed substrate 10a and the next substrate 10b may be changed according to the number of processing units 300 required for processing a substrate in the series. In more detail, the processed substrate 10a stored with the processing unit 300 in FIG. 19A may be transferred to the next processing unit 300 in FIG. 20A as the substrate 10b to be processed therein, and the processed substrate 10a stored within the processing unit 300 in FIG. 20A may be transferred to the next processing unit 300 as the next substrate 10b to be processed therein. This allows the substrate to be transferred directly from one processing unit to the next processing unit without transferring the substrate 10a or 10b between the hands 150a and 150b. Accordingly, the substrate can be transferred with high efficiency.

<B-4. Structure and Operation of Substrate Holding Mechanisms 310a and 310b>

The structure and operation of the substrate holding mechanisms 310a and 310b in the processing unit 300 will now be described with particular reference to FIG. 21.

<B-4-1. Spin Coating Device>

Figure 21:
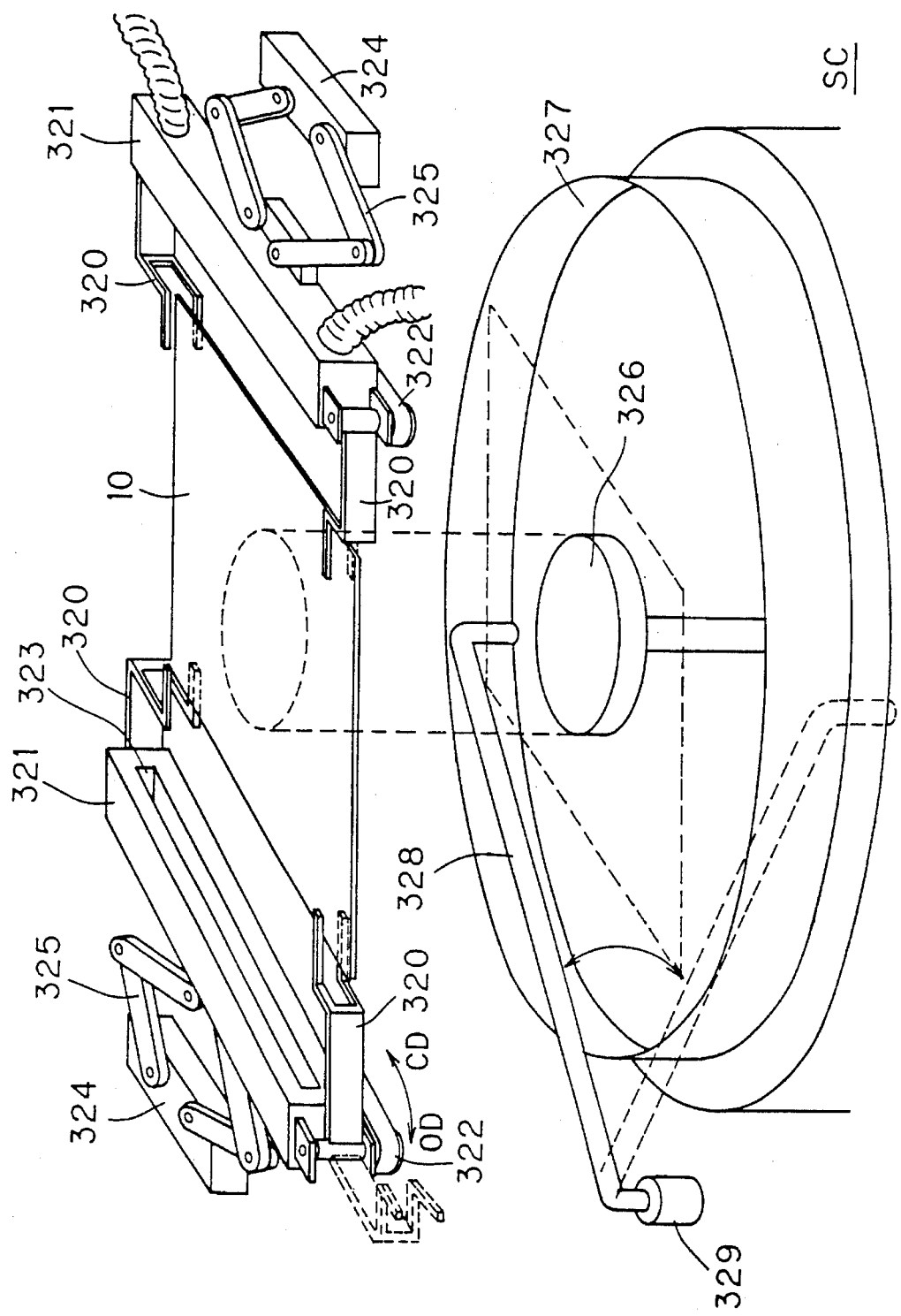
FIG. 21 is a perspective of an embodiment of a substrate holding mechanisms in a spin coating device.

The substrate holding mechanisms 310a and 310b in the spin coating device SC of FIG. 21 comprise four pins 320 each of which has upper and lower claws. The pins 320 are pivotally fitted to nozzles 321. The pins 320 are adapted to be driven through a belt 322 so as to swing horizontally. When the pins 320 are positioned in closed state, as indicated by solid line in FIG. 21, the substrate 10 is supported by one of the claws.

Each of the nozzles 321 has a spray hole 323 for spaying rinsing liquid toward the edge portions of the substrate 10 held by the pins 320, the spay hole 323 extends horizontally along a side of the substrate 10. Horizontal arm mechanisms 325 connect between bases 324 and the nozzles 321, and adjust the space between the nozzles 321 as a function of the size of the substrate 10. There is a rotary table 326 that is rotatable in a horizontal plane and is movable vertically. The rotary table 326 is connected to suction means (not shown) to apply suction to the bottom surface of the substrate 10, so that the substrate 10 is held on the rotary table 326. A nozzle 328 for spraying treating liquid, such as resist liquid, toward the substrate 10 is disposed between the pins 320 and top edge portions of a cup 327 located under the pins 320. The nozzle for treating liquid 328 is pivotable horizontally about a pivot axis 329.

The operation of the spin coating device SC will be now explained, assuming that the processed substrate 10a is put on the upper claws of the pins 320 and the next substrate 10b is put on the lower claws thereof. The next substrate 10b to be processed in the device SC is transferred from the substrate transferring device 101 onto the claws of the pins 320. During the transferring of the next substrate 10b, the rotary table 326 elevates upwardly from the position lower than the pins 320 to the upper position so that the substrate 10b rises to the surface of the lower claws. Thus, the substrate 10b is applied to suction and held by means of the rotary table 326. Thereafter, the pins 320 pivot in an opening direction OD, and then the substrate 10b is lowered while being held by the rotary table 326, so as to being located in the cup 327. During substrate locating, the nozzle for treating liquid 328 is located at the retracted or shunting position as indicated by dashed line in FIG. 21 in order not to interface with the substrate 10b.

Next, the nozzle 328 pivots until the lead edge portion thereof is located above the center of the rotary table 326. The rotary table 326 rotates in a horizontal plane after the resist liquid has been sprayed, so that the upper surface of the substrate 10b is coated with the resist liquid. The cup 327 recovers excess resist liquid and prevents same from scattering. Upon completion of coating, the rotary table 326 stops rotating, and then the nozzle for treating liquid 328 rotates to the shunting position.

The substrate 10a subjected to the above spin coating treatment is lifted by means of rotary table 326 so as to rise to the surface of the upper claws of the pins 320. Following that, the pins 320 pivot in the closing direction CD while the rotary table 326 is lowered to the position slightly lower than the pins 320. Thus, the substrate 10a is transferred from the rotary table 326 onto the upper claws of the pins 320.

Then, the hands 150a and 150b (FIG. 12) move to the position at which the processed substrate 10a is located, and exchange the processed substrate 10a for the next substrate 10b to be processed in the spin coating device SC. The next substrate 10b transferred to the lower claws of the pins 320 is put on the rotary table 326 by elevating the rotary table 326. The spin coating device SC then repeats the above processing.

The substrate holding mechanism described above can also be applied to devices such as a spin scrubbing device and a spin developing device.

<B-4-2. Hot Plate HP>

Figure 22:
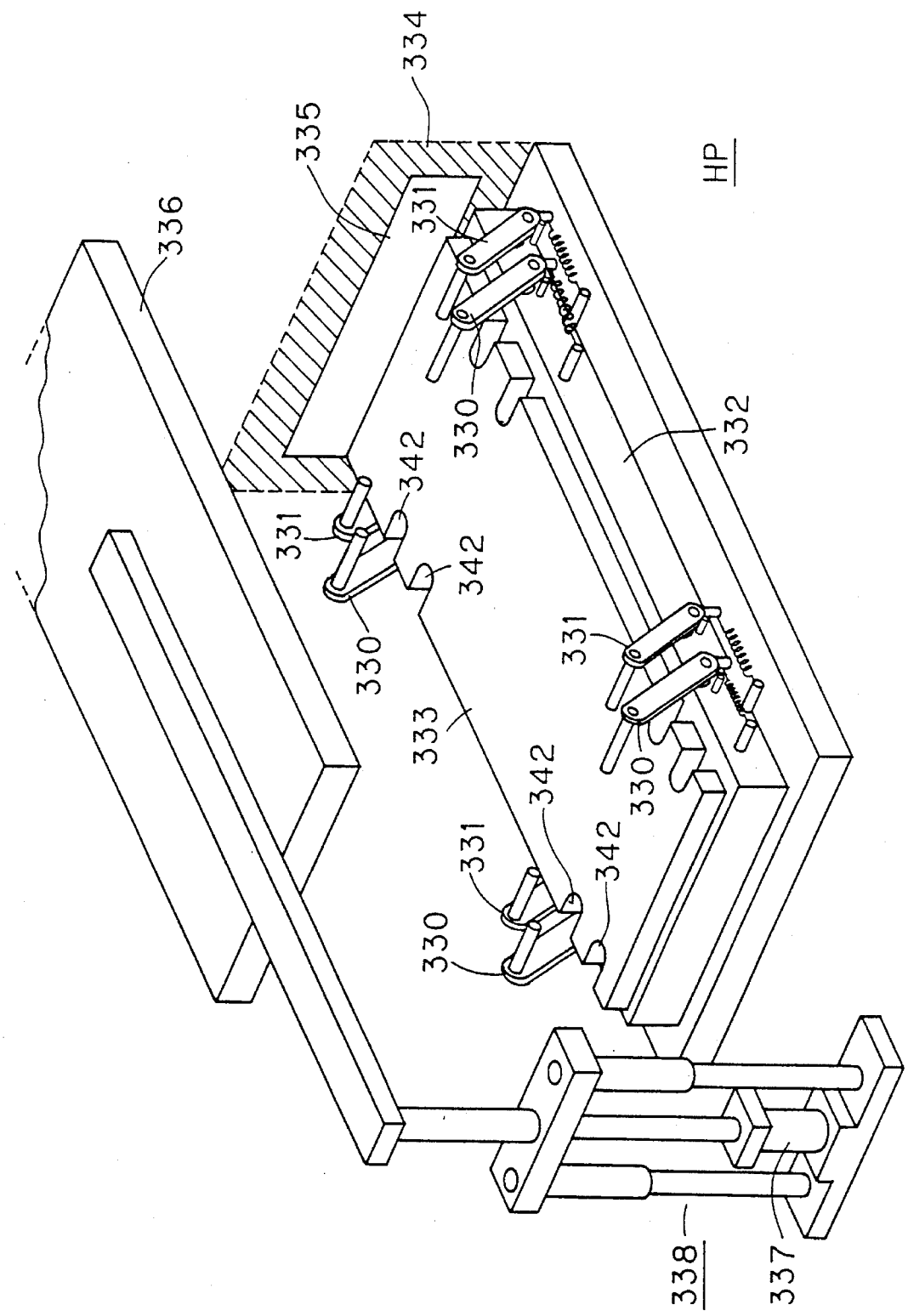
FIG. 22 is a perspective of an embodiment of a substrate holding mechanisms in hot hot plate.

The substrate holding mechanisms 310a and 310b in the hot plate HP will now be described with particular reference to FIG. 22. The upper substrate holding mechanism 310a comprises four upper levers 330 while the lower substrate holding mechanism 310b comprises four lower levers 331. Each of the levers 330 and 331 includes a claw in the form of a round bar. The levers 330 and 331 are pivotally mounted to a heater 332. A sub-plate 333 which receives the substrate 10 directly, is located above the heater 332. The hot plate HP includes a front panel 334 having a window 335 through which the substrate transferring device 101 inserts substrates into the hot plate HP. There is a plate 336 supported by an elevator 338 above the upper and lower levers 330 and 331. Thus, upon being driven by an air cylinder 337 provided in the elevator 338, the plate 336 goes up and down.

Figure 23:
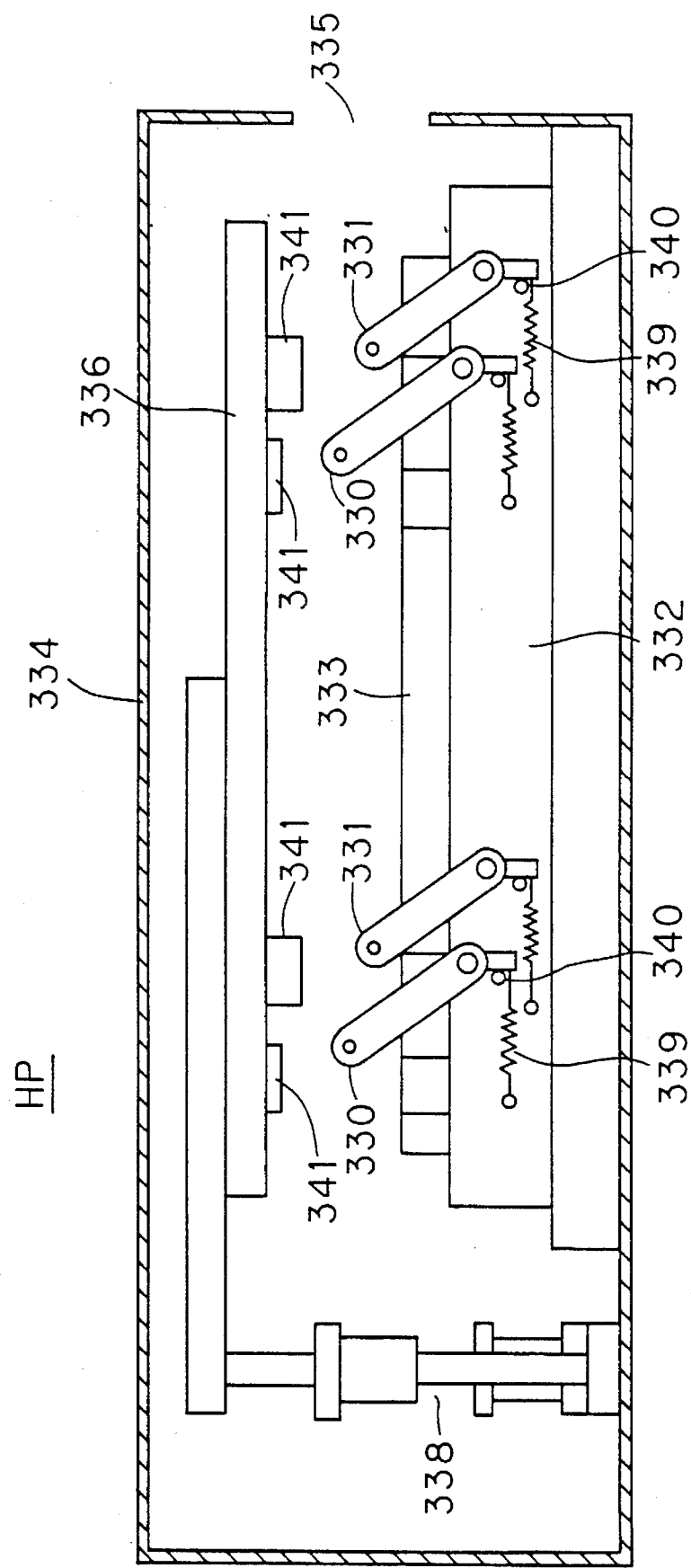
FIG. 23 is an internal side view of the hot plate in FIG. 22.

Now referring to FIG. 23 for viewing the insides of the hot plate HP each of the upper and lower levers 330 and 331 is biased by a spring 339 so that the claw upwardly stands up. Stoppers 340 limit pivoting of the levers 330 and 331 under the influence of the spring bias force, to locate the levers 330 and 311 at the predetermined positions shown. In this stopped state, the claws of the upper levers 330 are positioned at the position higher than the claws of the lower levers 331. As the plate 336 goes down, a pad 341 fixed on the bottom surface of the plate 336 contacts the top portions of the upper levers 330 and pushes the upper lever 330 down, and also contacts the top portions of the lower levers 331 and pushes the lower lever 331 down. Trenches 342 (FIG. 22) are provided to the side surface of the sub-plate 333 so that the claws of the upper and lower levers 330 and 331 are shunted to the trenches 342 when the plate 336 goes down.

Figure 24:
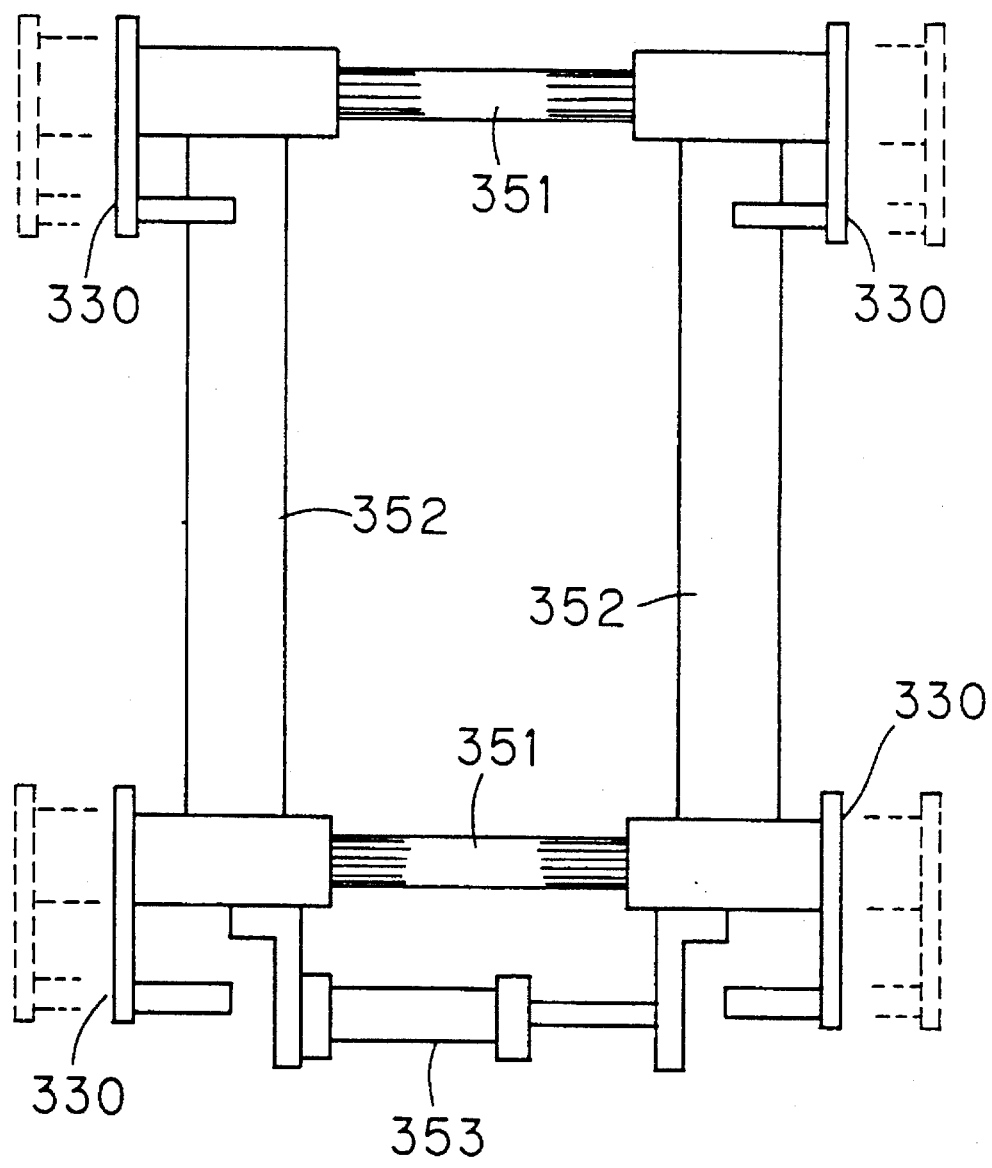
FIG. 24 is a plan view of a link mechanism which connects between upper levers.

Link mechanism 350 (FIG. 24) connects between the upper levers 330. More particularly, upper levers 330 are connected to each other through splines 351 and link plates 352 so that the pivot points coincide with each other. The side width or distance between a pair of the upper levers 330 which are connected to each other through the spline 351 can be varied by the action of the air cylinder 353.

In FIG. 25 respective substrates 10a and 10b are seen supported on the claws of the corresponding upper and lower levers 330 and 331. The substrate holding mechanism described above can also be applied to a cool plate CP or the like.

<B-4-3. First Operation of Hot Plate HP>

Figure 26:
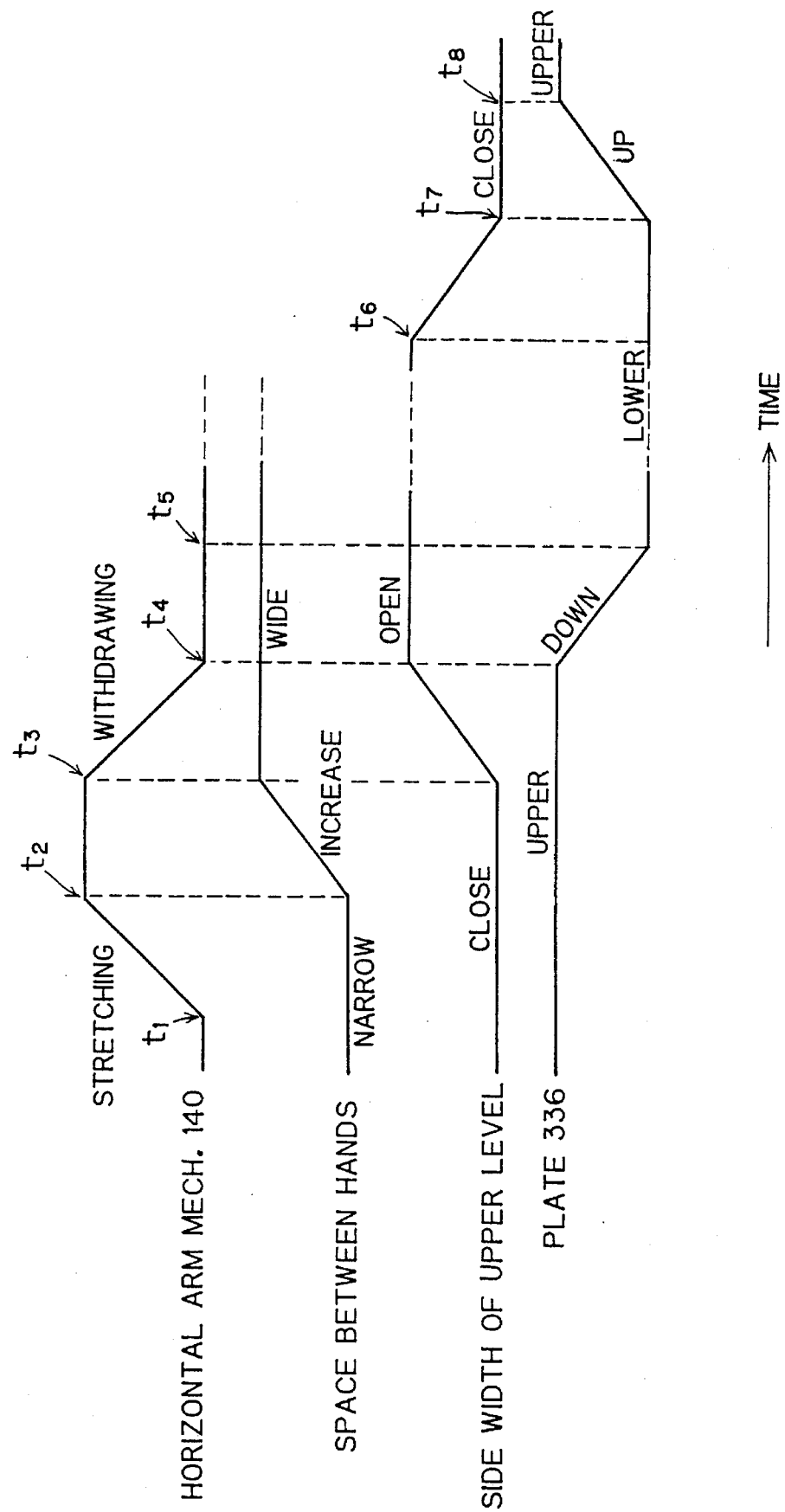
FIG. 26 is a timing chart illustrating the first operation of the substrate transferring device and the hot plate, assuming that the processed substrate is put on claws of the upper levers while the next substrate is put on claws of lower levers.

FIG. 26 is a timing chart illustrating the first operation of the substrate transferring device 101 and the hot plate HP, assuming that the processed substrate 10a is put on the claws on the upper levers 330 while the next substrate 10b should be put on the claws of the lower levers 331.

Initially, the processed substrate 10a is put on the claws of the upper levers 330 while the plate 336 is located at the upper position. The substrate transferring device 101 is brought to a position in front of the hot plate HP with the lower hand 150b thereof holding the next substrate 10b to be processed in the hot plate HP. The horizontal arm mechanism 140 is withdrawn while the hands 150a and 150b are in the narrow state.

The hands 150a and 150b are inserted into the hot plate HP through the window 335 by stretching the horizontal arm mechanism 140. The upper hand 150a reaches the position under the processed substrate 10a in the hot plate and the next substrate 10b on the hands 150b is raised to the position above the claws of the lower levers 331 (time t1 to time t2).

The space between the hands 150a and 150b increases by operating the space controlling mechanism 170, whereby the processed substrate 10a is transferred from the claws of the upper levers 330 to the upper hand 150a while the next substrate 10b to be processed is transferred from the lower hand 150b to the claws of the lower lever 331 (time t2 to time t3). Thus, the exchange of the processed substrate 10a for the next substrate is completed. Next, the horizontal arm mechanism 140 is withdrawn with the space between the hands 150a and 150b being in the wide state, to store the processed substrate 10a within the housing 131. At the same time, the air cylinder 353 acts to expand the side width wide between the upper lever 330 (time t3 to t4).

The plate 336 comes down, to thereby lower the lower levers 331 supporting the next substrate 10b, so that the next substrate 10b is put on the upper surface of the sub-plate 333 (time t4 to time t5). Although the upper levers 330 are also pushed down by the plate 336 during the above operation, the increase in the side width between the upper levers 330 prevents interference with the substrate 10b. After time t4, the substrate 10a is transferred to another processing unit by means of the substrate transferring device 101, to carry out the next process.

After time t5, heat processing for the substrate 10b is carried out on the sub-plate 333 (time t5 to time t6). Upon completion of heat processing, the space between the upper levers 330 is narrowed (time t6 to time t7), and then the plate 336 rises (time t7 to time t8). As the plate 336 goes up, the upper and lower levers 330 and 331 rise gradually. Since the side width between the upper levers 330 is narrow, the processed substrate 10a subjected to the above heat processing is put on the claws of the upper levers 330 and goes up. After the plate 336 rises fully, exchange of the processed substrate 10a for the next substrate 10b is carried out. In other words, after time t8, the operation similar to that from time t1 to time t8 is repeated.

<B-4-4. Second Operation of Hot Plate HP>

Figure 27:
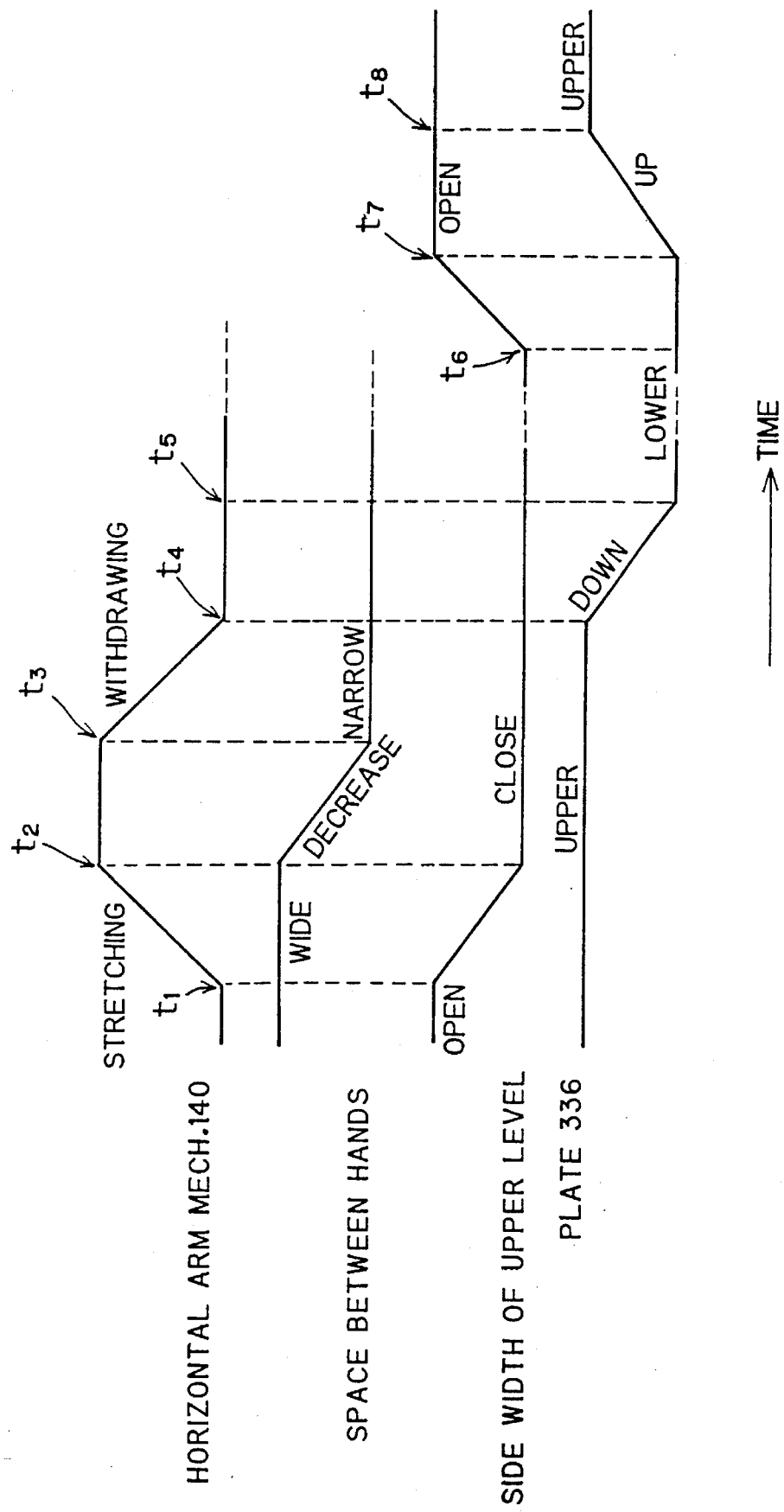
FIG. 27 is a timing chart illustrating the second operation of the substrate transferring device and the hot plate, assuming that the processed substrate is put on the claws of the lower levers while the next substrate is put on the claws of the upper levers, in reverse.

FIG. 27 is a timing chart illustrating the second operation of the substrate transferring device 101 and the hot plate HP, assuming that the processed substrate 10a is put on the claws of the lower levers 331 while the next substrate 10b is put on the claws of the upper levers 330, in reverse.

Initially, the processed substrate 10a is put on the claws of the lower levers 331 while the plate 336 is located at the upper position. The substrate transferring device 101 is brought to a position in front of the hot plate HP with the upper hand 150a thereof holding the substrate 10b to be processed in the hot plate HP. The horizontal arm mechanism 140 is withdrawn while the hands 150a and 150b are in the wide state.

The hands 150a and 150b are inserted into hot plate HP through the window 335 by stretching the horizontal arm mechanism 140 until the lower hand 150b reaches the position under the processed substrate 10a in the hot plates and the next substrate 10b put on the hand 150a reaches the position above the claws of the upper levers 330 (time t1 to time t2). At the same time, the side width of the upper levers 330 is narrowed.

The space between the hands 150a and 150b is narrowed by actuating the space controlling mechanism 170, whereby the processed substrate 10a is transferred from the claws of the lower levers 331 to the lower hand 150a while the next substrate 10b to be processed is transferred from the upper hand 150b to the claws of the lower lever 331 (time t2 to time t3). Thus, exchange of the processed substrate 10a for the next substrate is completed. Next, the horizontal arm mechanism 140 is withdrawn with the space between the hands 150a and 150b being in the narrow state, to store the processed substrate 10a with the housing 131.

The plate 336 comes down, to thereby push down the upper levers 330 supporting the substrate 10b, the result being that substrate 10b is put on the upper surface of the sub-plate 333 (time t4 to time t5). Since the lower levers 331 are pushed down at the same time, there is no interference with the substrate 10b. After time t4, the substrate 10a is transferred by the substrate transferring device 101 to another processing unit to carry out the next process.

After time t5, heat processing for the substrate 10b is carried out on the sub-plate 333 (time t5 to time t6). Upon completion of heat processing, the space between the lower levers 331 is expanded (time t6 to time t7), and then the plate 336 rises (time t7 to time t8). As the plate 336 goes up, the upper and lower levers 330 and 331 rises gradually. Since the side width between the upper levers 330 is wide, the processed substrate 10a subjected to the above heat processing is placed on the claws of the lower levers 331 and rises. After the plate 336 rises fully, exchange of the processed substrate 10a for the next substrate 10b is carried out between the substrate transferring device 101 and the hot plate HP. In other words, after time t8, the operation similar to that from time t1 to time t8.

<B-5. Efficiency of Processing>

The efficiency of the processing in the substrate processing apparatus 1 described above will now be explained with reference to Table 2 which shows a series of processing steps carried out in the apparatus 1.

TABLE 2

| PROCESSING | PROCESSING PART | TEMP. °(C.) | TIME (SEC.) | TRANSFERRING DEVICE |
|---|---|---|---|---|
| SPIN SCRUBBING | SS | | | 101 |
| BAKE FOR DEHYDRATION | HP1 | 90 | 50 | |
| BAKE FOR DEHYDRATION | HP2 | 90 | 50 | |
| COOLING | CP1 | 30 | 50 | |
| BAKE FOR DEHYDRATION | HP3 | 80 | 50 | 102 |
| COOLING | CP2 | 23 | 50 | |
| SPIN COATING | SC | | | |
| EDGE RINSING | ER | | | |
| PRELIMINARY BAKE | HP4 | 100 | 50 | 103 |
| PRELIMINARY BAKE | HP5 | 100 | 50 | |
| PRELIMINARY BAKE | HP6 | 100 | 50 | |
| COOLING | CP3 | 23 | 50 | |

It is understood from Table 2 that a total time T for the series of processing steps is 50 seconds. Now if an average time required for transferring the substrate from one processing unit to other processing unit and for taking the substrate in and out of the processing unit by each of the substrate transferring devices 101 to 103 is $\Delta T$, and the number of processing units required in one substrate processing apparatus being N, the following relationship holds.

$$\Delta T \times (N+1) \leq T \tag{1}$$

The reason why the expression (1) includes a term "(N+1)" is because it is necessary for the substrate transferring device to take the substrate in and out of the processing unit (N−1) times while moving among N processing units and that the substrate transferring device takes the substrate in and out of other processing units before and after the above movement. In the case where the average time of $\Delta T$ is 10 seconds, for example, the following expression (2) is given from the expression (1).

$$10 \text{ sec.} \times (N+1) \leq 50 \text{ sec.} \tag{2}$$

Hence, $N \leq 4$, the maximum value becomes "4". The series of processing steps listed in Table 2 may be divided by four units. The substrate transferring device 101 takes a substrate from the spin scrubbing device SS to the cool plate CP1, the substrate transferring device 102 takes a substrate from the hot plate HP3 for dehydration bake to the edge and back rinsing part ER, and the substrate transferring device 103 takes a substrate from the hot plate HP4 for preliminary bake to the cool plate CP3. In Table 2, parts corresponding to the respective substrate transferring devices 101 to 103 are listed in section "TRANSFERRING DEVICE", are indicated by symbols "101", "102" and "103". That is, the respective substrate transferring devices 101 to 103 transfer the substrate only among the corresponding parts.

The substrate transfer between the first and second substrate transferring devices 101 and 102 is carried out through the interface IF1 (see FIG. 10). For example, the substrate subjected to processing in the cool plate CP1 is transferred onto the interface IF1 through the substrate transferring device 101 and then picked up by the substrate transferring device 102.

The average time $\Delta T$ is a time required for exchanging a substrate for the substrate held in the substrate holding mechanism of the processing unit and then transferring the substrate to the next processing unit. Since each of the substrate transferring devices 101 to 103 can not only take the next substrate in but also takes the processed substrate out of the processing unit at the same time, the process and the substrate exchange in each processing units can be terminated until the average time $\Delta T$ has passed. If the substrate transferring device can carry out only taking the substrate in or out of the processing unit at one time, such substrate transferring device must move without holding the substrate. Thus, such substrate transferring device can barely charge about N/2 of processing units. On the other hand, the substrate transferring devices 101 to 103 having the hands 150a and 150b can exchange the processed substrate for the next substrate in cooperation with the substrate holding mechanisms 310a and 310b. Thus, using devices 101 to 103, the substrate can be transferred at high efficiency.

In the substrate transferring devices 101 to 103, the processed substrate can be exchanged for the next substrate by means of controlling the space between the hands 150a and 150b, resulting in that the time required for exchanging the processed substrate for the next substrate is shortened. This allows the efficiency of transferring the substrate to raise. Furthermore, the shortening of the time for exchange of the processed substrate for the next substrate allows the average time $\Delta T$ to shorten. Accordingly, the number of processing units which are serviced by one substrate transferring device increases, as understood from the expression (1). From a different point of view, the number of substrate transferring devices to be provided in the substrate processing apparatus 1 decreases.

In each of the processing units, the two substrate holding mechanisms are arranged in a stack and the substrate moves between the substrate holding mechanism and the position where the processing for the substrate is carried out. Accordingly, the time required for exchange of the processed substrate for the next substrate is slight with respect to the total time T.

According to the substrate processing apparatus 1, the substrate processing is achieved at high efficiency by means of the substrate transferring device.

<B-6. Modification>

Figure 28:
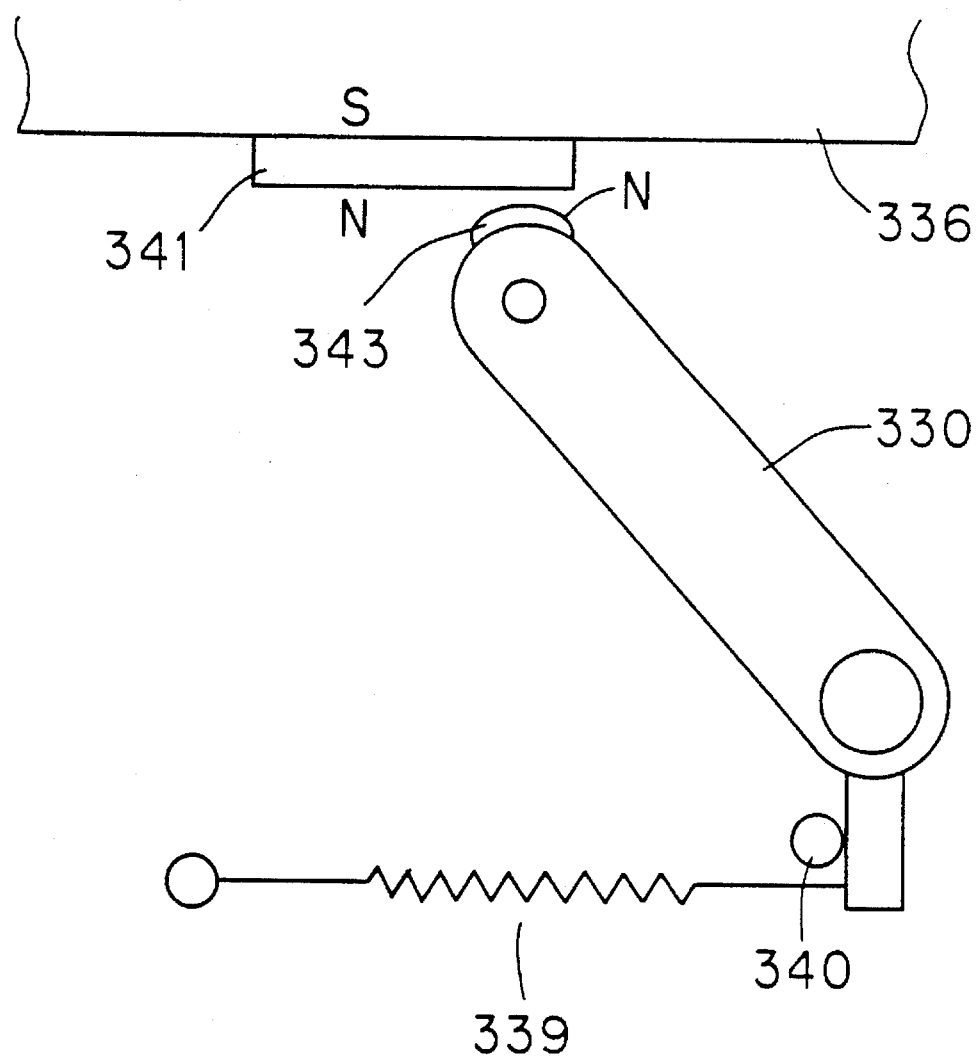
FIG. 28 is an elevation showing a modification of the hot plate.

(1) FIG. 28 illustrates a modified construction of plate 336 and upper lever 330 in the hot plate HP. In the modification of FIG. 28, the pad 341 is a permanent magnet and permanent magnet 343 is fixed on the top of the upper lever 330 so as to face to the pad 341. The surfaces of the pad 341 and the magnet 343, which face to each other, have the same magnetic polarity. Thus, as the plate 336 goes down, the magnetic resiliency increases and pushes down the upper lever 330 without contact to the pad 341. The lower lever 331 facing the pad 341 is identical in structure and operation to upper lever 330 and magnet 343 thereon. With this modified construction the operative engagement between plate 336 and levers 330, 331 does not result in particles being generated.

Figure 29:
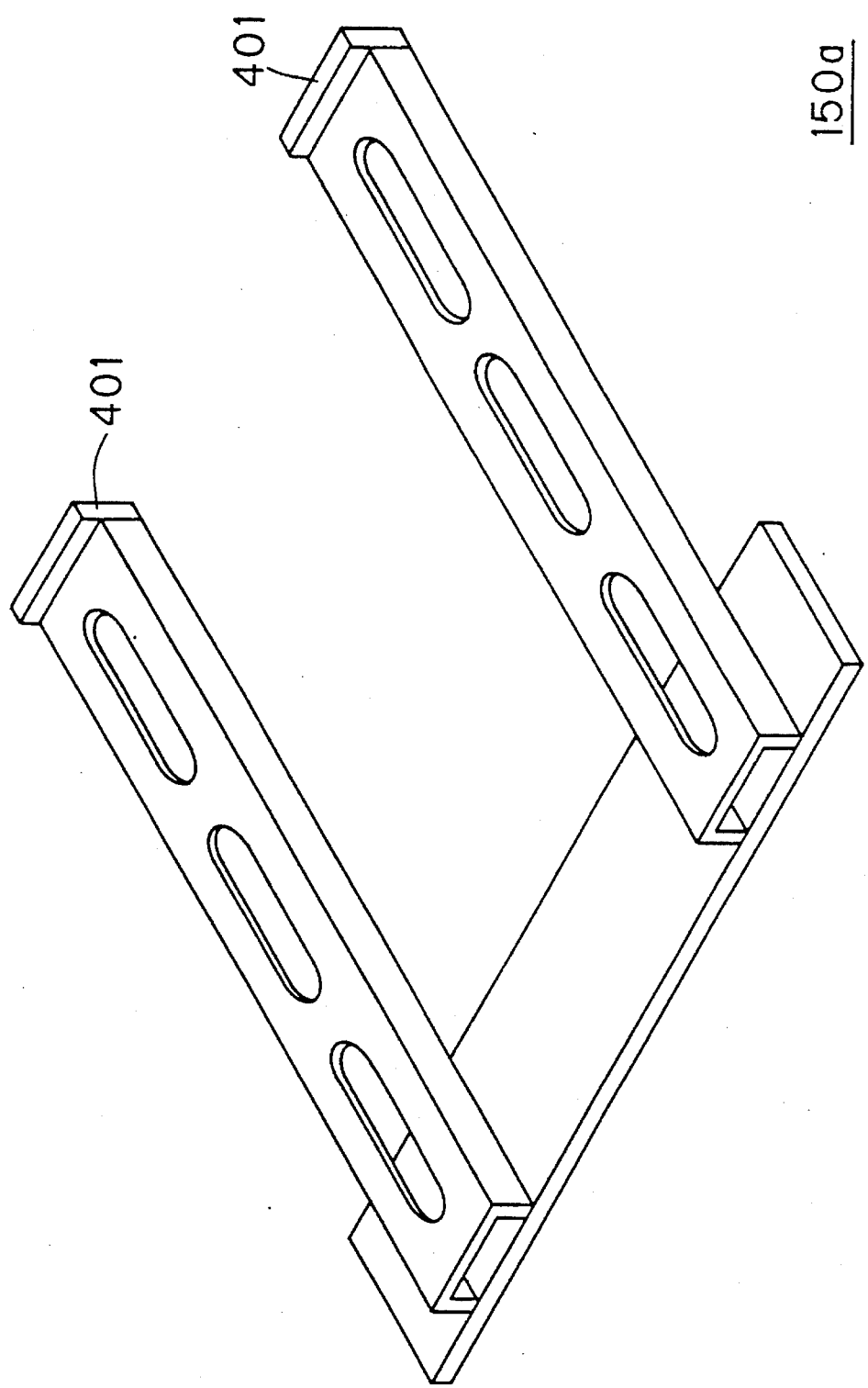
FIG. 29 is a perspective showing a hand in the modification of the hot plate.

(2) FIG. 29 illustrates a modification of the upper hand 150a. Although the upper hand 150a of FIG. 12 has the two claws made from the plate, each of the claws may, as in FIG. 29, be made from a bar having a C-shape in section. Stoppers 401 may be provided at the lead edge portions of each claw in order to prevent the substrate from dropping out of the hand 150a and from displacement. The lower hand 150b may be structured similar to the upper hand 150a. The claw may have a H-shape, an I-shape or the like in section instead of the C-shape in section. The lightweight claws are shaped in section so that they can support a heavy substrate without deformation thereof.

(3) In order to generate the rotary force, an electrical motor may be used instead of the air cylinder 166. The air cylinder 166 excels because it generates high torque with small size and can be positioned between the upper and lower hands 150a and 150b.

(4) Although the processes in the respective processing units are exemplified in Table 2, they may be changed optionally. For example, the heating time required in the hot plates HP4 to HP6 can be different from that shown in Table 2. The next substrate may be subjected to heat treatment by means of one hot plate not having the substrate in place of heat treatment by means of the three hot plates HP4 to HP6 to which the substrate is introduced in this order.

(5) The number of arms in the arm mechanism on the substrate transferring device is not limited. The vertical arm mechanism may be arranged on the horizontal arm mechanism. Since in this case the connecting part between the vertical arm mechanism and the hands must be long, the embodiment described above is of advantage.

(6) The present invention can be applied to the substrate processing apparatus for processing substrates such as semiconductor wafers or the like as well as the apparatus for processing the substrates of liquid crystal display.

While the invention has been shown and described in detail, the foregoing description is in all aspects illustrative and not restrictive. It is therefore understood that numerous modifications and variations can be devised without departing from the scope of the invention.

We claim:

1. A substrate processing apparatus for transferring and processing substrates having plate configurations, said apparatus comprising:

processing means including a plurality of processing units for processing each of said substrates serially one by one, each of said processing units processing said substrates in a selected one of a plurality of different manners, each of said processing units including a holding component for holding each of said substrates horizontally while said substrate is processed in said processing unit, said processing units being arranged in upper and lower processing rows, each processing row comprises selected ones of said plurality of said processing units arranged in a predetermined horizontal direction, said upper processing row being arranged above and in parallel with said lower processing row; and transferring means, arranged along both said upper and lower processing rows, for transporting each of said substrates, one by one in a predetermined order, while simultaneously supporting each of said substrates horizontally, to each of said processing units, said transferring means also receiving each of said substrates from said holding component of each of said plurality of processing units and transferring said substrate to said holding component of another one of said processing units.

2. A substrate processing apparatus of claim 1, wherein said transferring means includes a horizontally movable component for transferring said substrate in a horizontal direction along said upper and lower processing rows, and a vertically movable component for transferring said substrate in a vertical direction between said upper and lower processing rows.

3. A substrate processing apparatus of claim 1, further comprising means for supplying clean air downwardly to said transferring means.

4. A substrate processing apparatus of claim 1, wherein at least one of said processing units in said upper processing row includes a plurality of processing components each of which processes one of said plurality of substrates in an identical manner, said plurality of processing components being arranged vertically with respect to each other.

5. A substrate processing apparatus of claim 1, wherein at least one of said processing units in said lower processing row includes means for processing said substrates individually one by one while each of said substrates rotates around a vertical axis perpendicular to said substrate.

6. A substrate processing apparatus of claim 1, wherein at least one of said processing units in said upper processing row includes means for processing substrates individually one by one without rotating said substrates.

7. A substrate processing apparatus of claim 6, wherein at least one of said processing units in said upper processing row includes means for heating said substrate.

8. A substrate processing apparatus of claim 6, wherein at least one of said processing units in said upper processing row includes means for cooling said substrate.

9. A substrate processing apparatus of claim 6, wherein at least one of said processing units in said upper processing row includes means for coating said substrate with an adhesion agent.

10. A substrate processing apparatus of claim 5, wherein at least one of said processing units in said lower processing row includes means for coating a photo-resist liquid on said substrate while said substrate rotates and while said photo-resist liquid is on said substrate.

11. A substrate processing apparatus of claim 5, wherein at least one of said processing units in said lower processing row includes means for supplying developing liquid on said substrate while said substrate rotates.

12. A substrate processing apparatus of claim 1, wherein said substrate to be processed is generally rectangular.

13. A substrate processing apparatus of claim 12, wherein said substrate to be processed is a glass substrate used for manufacturing a liquid crystal display.

* * * * *